United States Patent [19]

Collins et al.

[11] Patent Number: 5,556,501
[45] Date of Patent: Sep. 17, 1996

[54] SILICON SCAVENGER IN AN INDUCTIVELY COUPLED RF PLASMA REACTOR

[75] Inventors: Kenneth S. Collins; Craig A. Roderick, both of San Jose; John R. Trow, Santa Clara; Chan-Lon Yang, Los Gatos; Jerry Y. Wong, Fremont; Jeffrey Marks, San Jose; Peter R. Keswick, Newark; David W. Groechel, Sunnyvale; Jay D. Pinson, II, San Jose, all of Calif.; Tetsuya Ishikawa, Chiba, Japan; Lawrence C. Lei, Cupertino, Calif.; Masato M. Toshima, Sunnyvale, Calif.; Gerald Z. Yin, Cupertino, Calif.

[73] Assignee: Applied Materials, Inc., Santa Clara, Calif.

[21] Appl. No.: 41,796

[22] Filed: Apr. 1, 1993

Related U.S. Application Data

[63] Continuation of Ser. No. 722,340, Jun. 27, 1991, abandoned, which is a continuation-in-part of Ser. No. 626,050, Dec. 7, 1990, abandoned, which is a continuation-in-part of Ser. No. 624,740, Dec. 3, 1990, abandoned, which is a continuation-in-part of Ser. No. 559,947, Jul. 31, 1990, abandoned, which is a continuation-in-part of Ser. No. 416,750, Oct. 3, 1989, Pat. No. 5,223,457.

[51] Int. Cl.$^6$ .................................................. C23F 1/02
[52] U.S. Cl. ............... 156/345; 204/298.34; 204/298.38; 204/298.37
[58] Field of Search ................... 204/298.16, 298.37, 204/298.34, 298.38, 298.08, 298.11, 298.31; 156/345; 315/111.21, 111.41, 111.51; 118/723 R, 621

[56] References Cited

U.S. PATENT DOCUMENTS

| | | | |
|---|---|---|---|
| 2,884,632 | 4/1959 | Dewitz et al. | 343/850 |
| 4,123,316 | 10/1978 | Tsuchimoto | 204/298.37 X |
| 4,368,092 | 1/1983 | Steinberg et al. | 156/345 |

(List continued on next page.)

FOREIGN PATENT DOCUMENTS

| | | |
|---|---|---|
| 0146446 | 6/1985 | European Pat. Off. . |
| 0272142 | 6/1988 | European Pat. Off. . |
| 0326405 | 8/1989 | European Pat. Off. . |
| 0343017 | 11/1989 | European Pat. Off. . |
| 0369919 | 11/1990 | European Pat. Off. . |
| 0489407 | 6/1992 | European Pat. Off. . |
| 61-107730 | 5/1986 | Japan ........................ H01L 21/302 |
| 63-9120 | 1/1988 | Japan ........................ H01L 21/302 |
| 63-155728 | 6/1988 | Japan ........................ H01L 21/302 |

OTHER PUBLICATIONS

"From Alchemy to Science: Technological Challenges"; T. Ohmi; 34 pages; no date.
"Hula Hoop Antennas: A Coming Trend?"; J. Boyer; from *Electronics* pp. 44–46; Jan. 11, 1963.
"Development of Dual Excitation Plasma . . . "; Goto et al.; 12 pages; no date.
"Application of a low–pressure radio frequency . . . "; Cook et al., from *J. Vac. Sci. Technol. B*, V. 8, No. 1; pp. 1–4; Feb. 1990.
"Selective Etching of SiO$_2$ Relative to Si by Plasma Reactive Sputter Etching"; S. Matsuo; J. Vac. Sci. Technol. 17(2); Mar./Apr. 1980; pp. 587–594.

(List continued on next page.)

*Primary Examiner*—Nam Nguyen
*Attorney, Agent, or Firm*—Birgit Morris; Peter J. Sgarbossa

[57] ABSTRACT

A domed plasma reactor chamber uses an antenna driven by RF energy (LF, MF, or VHF) which is inductively coupled inside the reactor dome. The antenna generates a high density, low energy plasma inside the chamber for etching metals, dielectrics and semiconductor materials. Auxiliary RF bias energy applied to the wafer support cathode controls the cathode sheath voltage and controls the ion energy independent of density. Various magnetic and voltage processing enhancement techniques are disclosed, along with etch processes, deposition processes and combined etch/deposition processed. The disclosed invention provides processing of sensitive devices without damage and without microloading, thus providing increased yields.

15 Claims, 7 Drawing Sheets

U.S. PATENT DOCUMENTS

| | | | |
|---|---|---|---|
| 4,375,051 | 2/1983 | Theall | 333/17 M |
| 4,412,906 | 11/1983 | Sato et al. | 204/298.07 |
| 4,513,022 | 4/1985 | Jansen et al. | 427/39 |
| 4,572,759 | 2/1986 | Benzing | 156/345 |
| 4,755,345 | 7/1988 | Baity, Jr. et al. | 376/123 |
| 4,756,810 | 7/1988 | Lamont, Jr. | 204/298.06 |
| 4,786,359 | 11/1988 | Stark et al. | 156/643 |
| 4,791,073 | 12/1988 | Nagy et al. | 437/67 |
| 4,795,529 | 10/1987 | Kawasaki et al. | 156/643 |
| 4,807,016 | 2/1989 | Douglas | 357/67 |
| 4,810,935 | 3/1989 | Boswell | 315/111.41 |
| 4,828,369 | 5/1989 | Hotomi | 315/111.21 X |
| 4,829,215 | 5/1989 | Kim et al. | 204/298.37 X |
| 4,844,775 | 12/1987 | Keeble | 156/643 |
| 4,849,675 | 7/1989 | Müller | 315/111.51 |
| 4,859,908 | 8/1989 | Yoshida et al. | 315/111.81 |
| 4,871,421 | 10/1989 | Ogle et al. | 156/643 |
| 4,906,898 | 3/1990 | Moisan | 315/39 |
| 4,918,031 | 4/1990 | Flamm et al. | 204/192.25 X |
| 4,948,458 | 8/1990 | Ogle | 156/643 |
| 4,950,377 | 8/1990 | Huebner | 204/192.32 |
| 4,990,229 | 2/1991 | Campbell et al. | 204/298.37 X |
| 5,074,456 | 12/1991 | Degner et al. | 228/121 |
| 5,122,251 | 2/1991 | Campbell et al. | 204/298.06 |

OTHER PUBLICATIONS

"Increasing the Etch Rate Ratio of $SiO_2$/Si in Fluorocarbon Plasma Etching"; J. W. Coburn; IBM. Tech. Disc. Bull.; V. 19, N. 10; Mar. 1977; 1 page.

"The Etching of $CHF_3$ Plasma Polymer in Fluorine–Containing Discharges"; A. J. Bariya et al.; J. Vac. Sci. Technol. B 9(1); Jan./Feb. 1991; pp. 1–7.

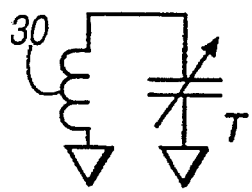
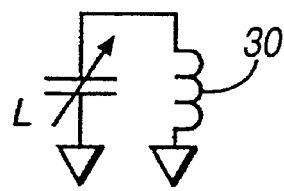
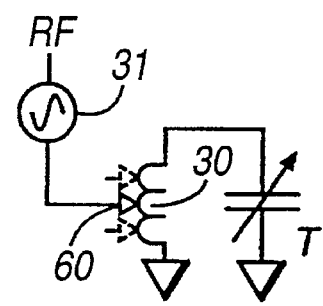
*FIG. 4*    *FIG. 5*    *FIG. 6*
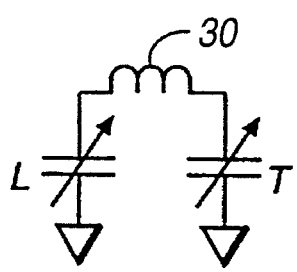
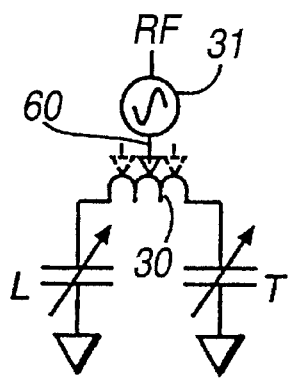
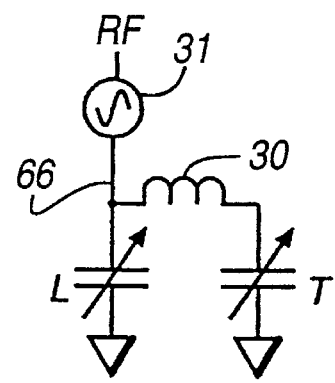
*FIG. 7*    *FIG. 8*    *FIG. 9*
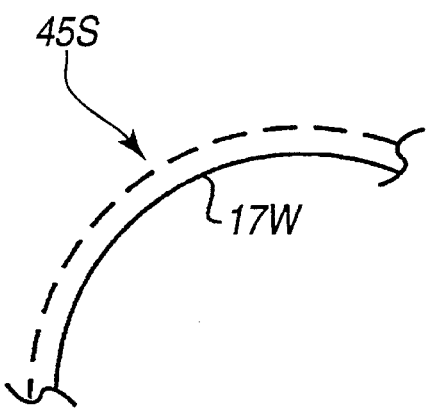
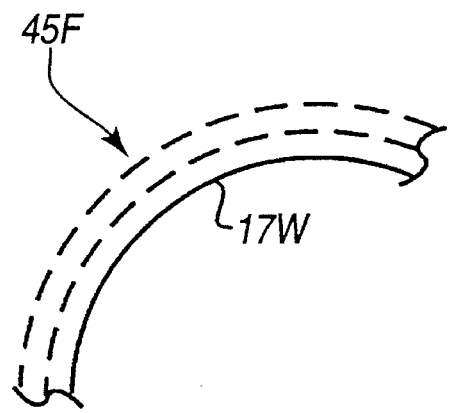
*FIG. 15A*    *FIG. 15B*

SILICON SCAVENGER IN AN INDUCTIVELY COUPLED RF PLASMA REACTOR

CROSS REFERENCE TO RELATED APPLICATIONS

This is a continuation of commonly assigned U.S. patent application Ser. No. 07/722,340 abandoned entitled PLASMA REACTOR USING INDUCTIVE RF COUPLING AND PROCESSES, filed Jun. 27, 1991, which application is a continuation-in-part of commonly assigned U.S. patent application Ser. No. 07/626,050, abandoned entitled PLASMA REACTOR USING UHF/VHF RESONANT ANTENNA SOURCE, AND PROCESSES, filed Dec. 7, 1990, in the name of inventor Collins (AMAT file no. 252-1), which is a continuation-in-part of commonly assigned U.S patent application Ser. No. 07/624,740 abandoned, entitled PLASMA REACTOR USING UHF/VHF RESONANT ANTENNA SOURCE, AND METHOD PROCESSES, filed Dec. 3, 1990, in the name of inventor Collins (AMAT file no. 252), which is a continuation-in-part of commonly assigned U.S. patent application Ser. No. 07/559,947, abandoned entitled UHF/VHF REACTOR SYSTEM, filed Jul. 31, 1990, in the name of inventors Collins et al (AMAT file no. 151-1) which is a continuation-in-part of commonly assigned U.S. patent application Ser. No. 07/416,750 filed Oct. 3, 1989 (AMAT 151) and now issued as U.S. Pat. No. 5,223,457.

BACKGROUND OF THE INVENTION

1. Field of the Invention

The present invention relates to RF plasma processing reactors and, more particularly, to an inventive plasma reactor which uses a radio frequency (RF) energy source and a multiple coil antenna for inductively coupling the associated RF electromagnetic wave to the plasma.

2. Description of the Related Technology

The trend toward increasingly dense integrated geometries has resulted in components and devices of very small geometry which are electrically sensitive and susceptible to damage when subjected to wafer sheath voltages as small as approximately 200–300 volts due to energetic particle bombardment or radiation. Unfortunately, such voltages are of smaller magnitude than the voltages to which the circuit components are subjected during standard integrated circuit fabrication processes.

Structures such as MOS capacitors and transistors fabricated for advanced devices have very thin (thickness <200 Angstroms) gate oxides. These devices may be damaged by charge-up, resulting in gate breakdown. This can occur in a plasma process when neutralization of surface charge does not occur, by non-uniform plasma potential/or density, or by large RF displacement currents. Conductors such as interconnect lines may be damaged for similar reasons as well.

RF Systems

Consider first prior art semiconductor processing systems such as CVD (chemical vapor deposition) and RIE (reactive ion etching) reactor systems. These systems may use radio frequency energy at low frequencies from about 10–500 kHz up to higher frequencies of about 13.56–40.68 MHz. Below about 1 MHz, ions and electrons can be accelerated by the oscillating electric field, and by any steady state electric field developed in the plasma. At such relatively low frequencies, the electrode sheath voltage produced at the wafers typically is up to one or more kilovolts peak, which is much higher than the damage threshold of 200–300 volts. Above several MHz, electrons are still able to follow the changing electric field. More massive ions are not able to follow the changing field, but are accelerated by steady state electric fields. In this frequency range (and at practical gas pressures and power levels), steady state sheath voltages are in the range of several hundred volts to 1,000 volts or more.

Magnetic Field-Enhancement

A favorite approach for decreasing the bias voltage in RF systems involves applying a magnetic field to the plasma. This B field confines the electrons to the region near the surface of the wafer and increases the ion flux density and-ion current and, thus, reduces the voltage and ion energy requirements. By way of comparison, an exemplary non-magnetic RIE process for etching silicon dioxide might use RF energy applied at 13.56 MHz, an asymmetrical system of 10–15 liters volume, 50 millitorr pressure and an anode area to wafer-support cathode area ratio of approximately (8–10) to 1, and develop wafer (cathode )sheath voltage of approximately 800 volts. The application of a magnetic field of 60 gauss may decrease the bias voltage approximately 25–30 percent, from 800 volts to about 500–600 volts, while increasing the etch rate by as much as about 50 percent.

However, the application of a stationary B field parallel to the wafer develops an E×B ion/electron drift and an associated plasma density gradient which is directed diametrically across the wafer. The plasma gradient causes non-uniform etching, deposition and other film properties across the wafer. The non-uniformities may be decreased by rotating the magnetic field around the wafer, typically either by mechanical movement of permanent magnets, or by using pairs of electromagnetic coils which are driven in quadrature, 90 degrees out of phase, or by instantaneously controlling the current in pairs of coils to step or otherwise move the magnetic field at a controlled rate. However, although rotating the field reduces the non-uniformity gradient, typically some degree of non-uniformity remains.

Furthermore, it is difficult to pack coils and, in particular, to pack two or more pairs of coils about a chamber and to achieve a compact system, especially when using a Helmholtz coil configuration and/or a multi-chamber system of individual magnetic-enhanced reactor chambers surrounding a common loadlock.

A unique reactor system which has the capability to instantaneously and selectively alter the magnetic field strength and direction, and which is designed for use in compact multichamber reactor systems, is disclosed in commonly assigned U.S. Pat. No. 4,842,683, issued Jun. 27, 1989, in the name of inventors Cheng et al.

Microwave/ECR Systems

Microwave and microwave ECR (electron cylotron resonance) systems use microwave energy of frequencies >800 MHz and, typically, a frequency of 2.45 GHz to excite the plasma. This technique produces a high density plasma, but low particle energies which may be below the minimum reaction threshold energy for many processes, such as the reactive ion etching of silicon dioxide. To compensate, energy-enhancing low frequency electrical power is coupled to the wafer support electrode and through the wafer to the plasma. Thus, the probability of wafer damage is decreased relative to previous systems.

Microwave and microwave ECR systems operated at practical power levels for semiconductor wafer processing such as etch or CVD require large waveguide for power transmission, and expensive tuners, directional couplers, circulators, and dummy loads for operation. Additionally, to satisfy the ECR condition for microwave ECR systems operated at the commercially available 2.45 GHz, a magnetic field of 875 gauss is necessitated, requiring large electromagnets, large power and cooling requirements.

Microwave and microwave ECR systems are not readily scalable. Hardware is available for 2.45 GHz, because this frequency is used for microwave ovens. 915 MHz systems are also available, although at higher cost. Hardware is not readily or economically available for other frequencies. As a consequence, to scale a 5–6 in. microwave system upward to accommodate larger semiconductor wafers requires the use of higher modes of operation. This scaling at a fixed frequency by operating at higher modes requires very tight process control to avoid so-called mode flipping to higher or lower order loads and resulting process changes. Alternatively, scaling can be accomplished, for example, for a 5–6 in. microwave cavity, by using a diverging magnetic field to spread out the plasma flux over a larger area. This method reduces effective power density and thus plasma density.

HF Transmission Line System

Previously mentioned, commonly assigned parent U.S. Pat. No. 5,210,466 is incorporated by reference. This incorporated application discloses a high frequency VHF/UHF reactor system in which the reactor chamber itself is configured in part as a transmission line structure for applying high frequency plasma generating energy to the chamber from a matching a network. The unique integral transmission line structure permits satisfaction of the requirements of a very short transmission line between the matching network and the load and permits the use of relatively high frequencies, 50 to 800 MHz. It enables the efficient, controllable application of RF plasma generating energy to the plasma electrodes for generating commercially acceptable etch and deposition rates at relatively low ion energies and low sheath voltages. The relatively low voltages reduce the probability of damage to electrically sensitive small geometry semiconductor devices. The VHF/UHF system avoids various other prior art shortcomings, such as the above-described scalability and power limitations.

SUMMARY OF THE INVENTION

In one aspect, our invention which overcomes prior art shortcomings is embodied in the construction and operation of an RF plasma processing system comprising a vacuum chamber having a source region and a processing region; means for inductively coupling RF electromagnetic energy into the processing chamber for generating a plasma within the chamber to fabricate an article such as a semiconductor wafer positioned, for example, at the coupling means or downstream relative to the coupling means; and a triode arrangement comprising an RF cathode in the processing region, an anode defined by the chamber walls, and a source region electrode which is electrically floating, grounded or connected to RF bias, for enhancing plasma processing. The construction of the source region electrode and/or the chamber walls defining the source region may include silicon for enhancing processes such as oxide etching.

Preferably, LF/VHF (low frequency to very high frequency) RF power within the range 100 kHz to 100 MHz is used. More preferably, LF/HF power within the range 100 kHz to 10 MHz is used. Most preferably, MF (medium frequency) power is used within the range 300 kHz to 3 MHz. Preferably, the coupling means is a multiple turn, cylindrical coil antenna of uncoiled electrical length $<\lambda/4$ where $\lambda$ is the wavelength of the high frequency RF excitation energy applied to the coil antenna during plasma operation.

Our invention also encompasses means connected to the antenna for tuning the antenna to resonance, as well as load means connected to the antenna to match the input impedance of the source to the output impedance of the means for supplying RF energy for the antenna. The tune means may be a variable capacitance electrically connected between one end of the antenna and RF ground. The load means may be a variable capacitance electrically connected between the other end of the antenna coil and RF ground. RF energy may be applied via a tap at a selected location along the coil antenna.

In another aspect, the system includes a dielectric dome or cylinder which defines the source region. Preferably, the coil antenna surrounds the dome for inductively coupling the high frequency electromagnetic energy into the chamber. The article which is fabricated can be located within the source region or dome, within or closely adjacent the volume or the bottom turn of the antenna, or preferably, downstream of the antenna.

Our invention also includes means for supplying gas to the chamber which comprises a gas inlet at the top of the dome, a first ring manifold at the base of the dome source region, and a second ring manifold surrounding at the wafer support electrode, for selectively supplying processing diluent, passivation and other gases to the chamber.

In yet another aspect, an AC power supply and control system capacitively couples AC bias power, typically of the same or similar frequency as the source coil power, to a wafer support cathode, thereby effecting control of the cathode sheath voltage and ion energy, independent of the plasma density control effected by the high frequency power. The system provides bias frequency selected to achieve a number of objectives. First, the upper frequency limit is selected to prevent "current-induced" damage (a too high frequency can cause charge-up damage to sensitive devices.) The lower frequency limit is selected in part to preclude "voltage-induced" damage. Lower frequency bias also yields higher wafer sheath voltages per unit bias power (less heating of substrates) and contributes less to plasma density and thus affords better independent control of ion density and energy. However, a too low bias frequency allows ions to follow the RF component of the wafer sheath electric field, thereby modulating ion energies. The result is a higher peak-to-average energy ratio and wider (double peak) ion energy distribution. Very low bias frequency causes insulator charge-up, inhibiting ion-induced processes during part of the bias frequency period. Conveniently, the preferred frequency ranges for satisfying the above considerations correspond to the source frequency ranges. That is, preferably LF/VHF (low frequency to very high frequency) power within the range 100 kHz to 100 MHz is used. More preferably, LF/HF power within the range 100 kHz to 10 MHz is used. Most preferably, MF (medium frequency) power is used within the range 300 kHz to 3 MHz.

Our invention further includes control means for cyclically pulsing the DC bias voltage between low and high values selected, respectively, to form a passivation coating on a first selected material on the wafer for providing a relatively low etch rate of that material and for selectively etching a second selected material at a relatively high rate and selectivity.

In another aspect, the chamber is evacuated by a first vacuum pump means connected to the chamber proper and a second vacuum pump means connected to the dome for establishing a vertical pressure differential across the dome for establishing a flow of uncharged ions out of the dome, and wherein the voltage at the wafer support electrode is sufficient to overcome the pressure differential so that charged particles flow toward the chamber proper.

Other aspects include a conductive, Faraday shield of different configurations which is interposed between the coil or other coupling means and the chamber to prevent coupling of the electric field component of the high frequency electromagnetic energy into the chamber. Also, a high frequency reflector positioned surrounding the coil or other coupling means concentrates radiation of the high frequency energy into the chamber.

Magnetic enhancement is supplied by peripheral permanent or electromagnet arrangements which apply a controlled static magnetic field parallel to the axis of the antenna, selected from uniform, diverging and magnetic mirror configurations, for controlling the location of and the transport of the plasma downstream relative to the wafer. Also, magnets may be mounted around the source and/or the chamber for applying a multipolar cusp field to the chamber in the vicinity of the wafer for confining the plasma to the wafer region while substantially eliminating the magnetic field across the wafer. In addition, a magnetic shunt may be positioned surrounding the wafer and the wafer support electrode for diverting any magnetic field from the wafer support electrode.

The system construction permits scaling of its size by selecting the frequency of operation, while retaining low mode operation.

In other, process aspects, our invention is embodied in a process for generating a plasma, comprising providing a vacuum chamber having source and process regions; supporting an article on an electrode in the process region; supplying processing gas to the chamber; using a cylindrical coil antenna of more than one coil turn having an electrical length $<\lambda/4$ wherein $\lambda$ is the wavelength of RF energy applied to the antenna, inductively coupling RF energy into the source region for generating a plasma to fabricate one or more materials on the article; and capacitively coupling RF energy into the chamber via the support electrode for controlling sheath voltage at the support electrode.

The process also encompasses automatically and iteratively tuning the antenna to resonance and loading the input impedance thereof to the impedance of the RF energy supply for the antenna.

In another aspect, our process for generating a plasma comprises providing a vacuum chamber having source and process regions, and having walls, an electrode in the process region and an electrode in the source region; connecting the electrode in the process region, the walls of the chamber and the source electrode electrically, with the process region electrode being the cathode, the walls being the anode and the electrical connection of the source electrode being selected from ground, floating and RF or DC bias; supporting an article on the electrode in the process region; supplying processing gas to the chamber; using a cylindrical coil antenna of one or more coil turns and having an electrical length $<\lambda/4$ where $\lambda$ is the wavelength of RF energy applied to the antenna, inductively coupling RF energy into the source region for generating a plasma to fabricate one or more materials on the article; and capacitively coupling RF energy into the chamber via the support electrode for controlling sheath voltage at the support electrode.

At least one of the source electrode and the chamber wall in the source region may be or contain silicon and the source electrode may be RF biased, for freeing the silicon into the plasma to enhance the processing.

In another aspect, the antenna power and the bias power delivered to the electrode are controlled for selectively effecting anisotropic, semi-anisotropic and isotropic etching.

The process encompasses etching silicon oxide in the presence of silicon, the use of silicon enhancement, and/or the use of additives such as CO and $CO_2$ for selectivity and etch profile enhancement. The process encompasses cyclically driving the bias voltage to a low value selected to form an etch suppressing layer on the silicon and to a high value to etch the silicon oxide at a high rate relative to the silicon.

The process also comprises sputter deposition of silicon oxide and the process of, first, applying relatively low level RF power to the support electrode for depositing silicon oxide and, second, applying relatively high level RF power to the support electrode for net sputter depositing silicon oxide and planarizing the silicon oxide.

Specific process aspects include but are not limited to etching oxide, including etching contact holes in oxide formed over polysilicon (polycrystalline silicon) and etching via holes in oxide formed over aluminum; so-called "light" etching of silicon oxide and polysilicon; high rate isotropic and anisotropic oxide etching; etching polysilicon conductors such as gates; photoresist stripping; anisotropic etching of single crystal silicon; anisotropic photoresist etching; low pressure plasma deposition of nitride and oxynitride; high pressure isotropic conformal deposition of oxide, oxynitride and nitride; etching metals, such as aluminum and titanium, and compounds and alloys thereof; and sputter facet deposition, locally and globally, and with planarization.

BRIEF DESCRIPTION OF THE DRAWING

FIG. 4 is a diagram of a tuning circuit.

FIG. 5 is a diagram of a load circuit.

FIG. 6 is a diagram of a load circuit which applies RF input power.

FIG. 7 is a diagram of a combination tuning circuit and load circuit.

FIG. 8 is a diagram of another embodiment of a combination tuning circuit and load circuit.

FIG. 9 is a diagram of still another embodiment of a combination tuning circuit and load circuit.

FIGS. 15A–B are embodiments of Faraday shields useful in the systems of the invention.

DETAILED DESCRIPTION OF THE PREFERRED EMBODIMENT(S)

1. Overview

Figure 1:
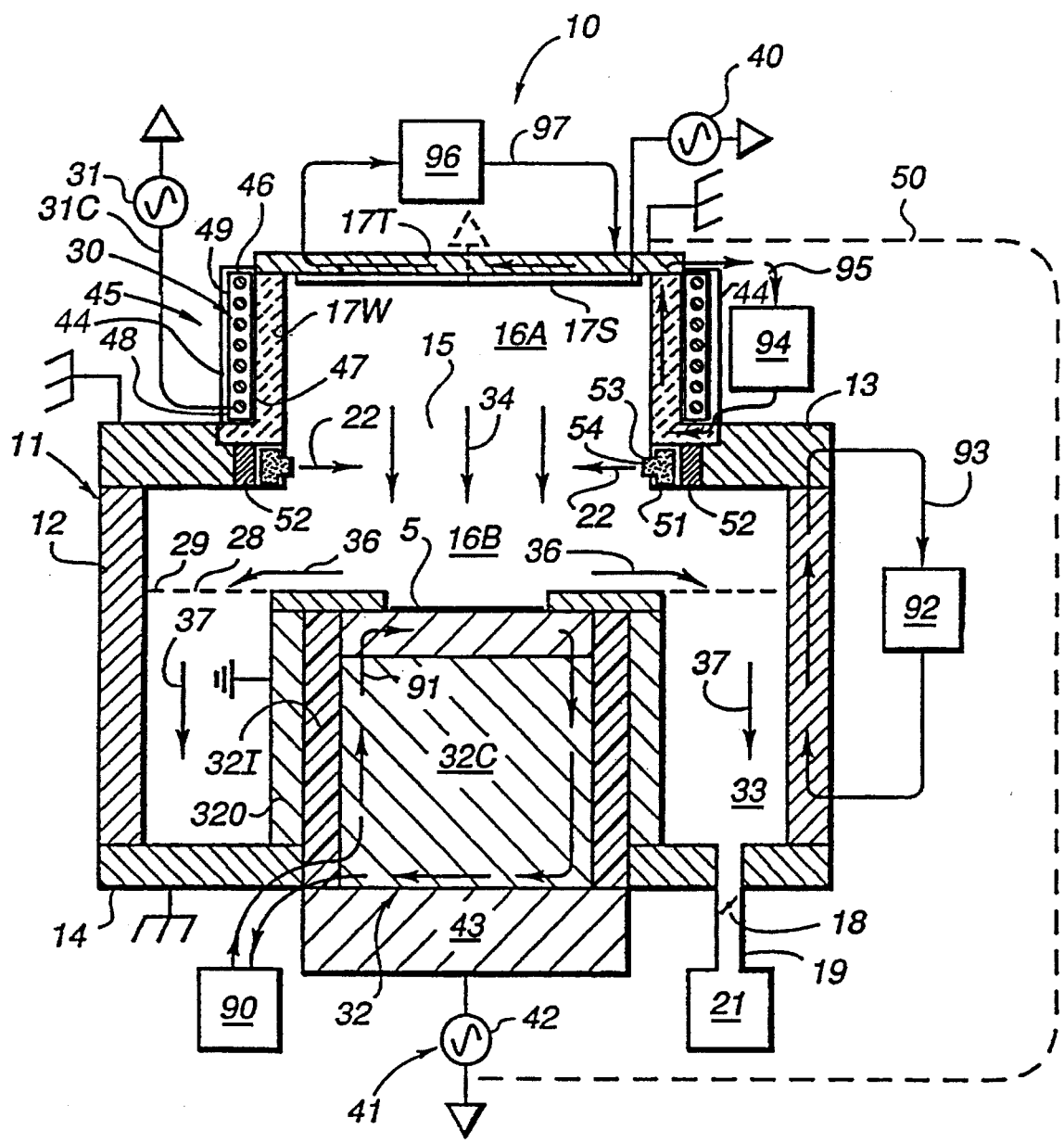
FIGS. 1–3 are schematic sectional views of a plasma reactor chamber system of the present invention.
Figure 2:
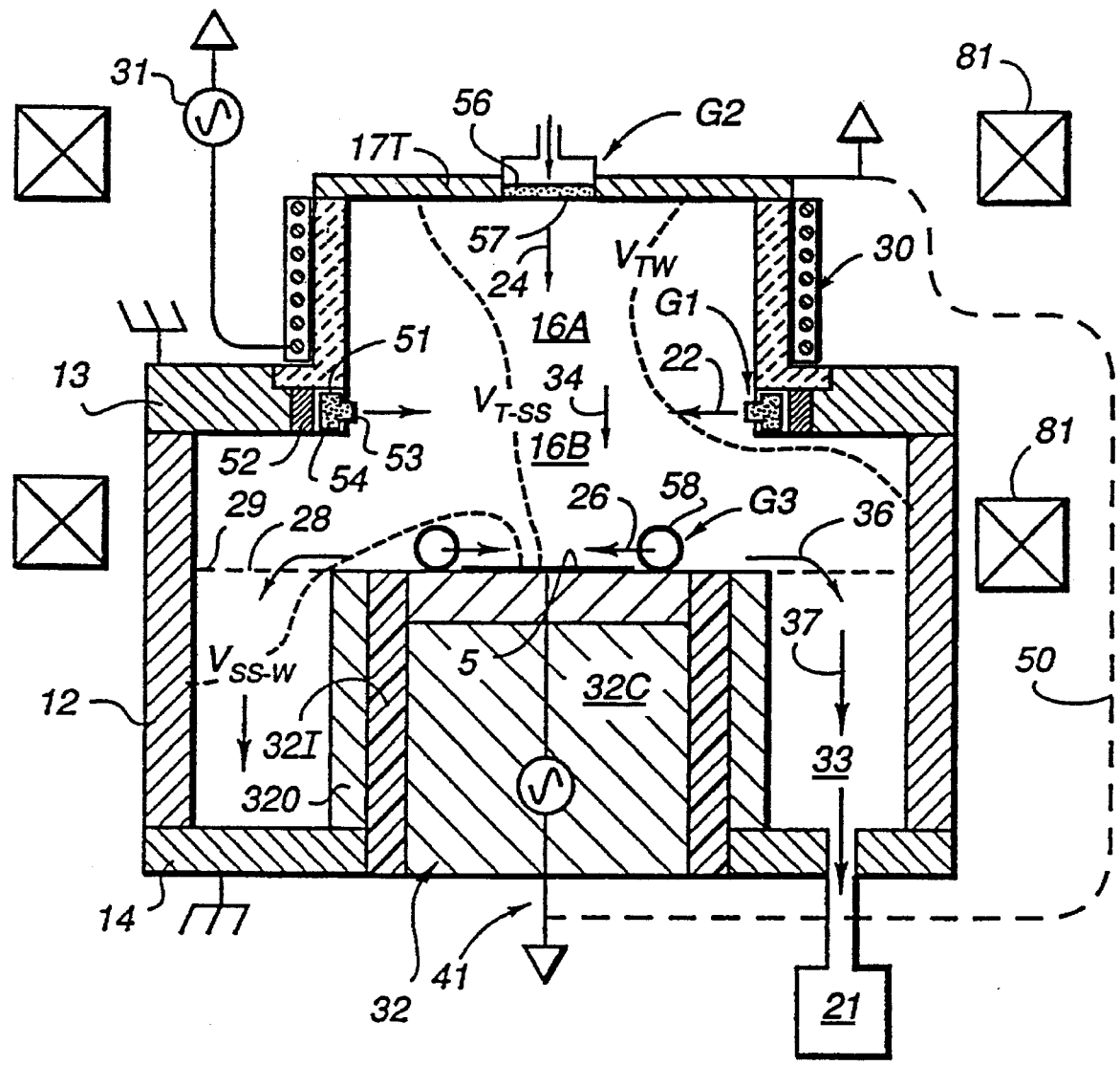
Figure 3:
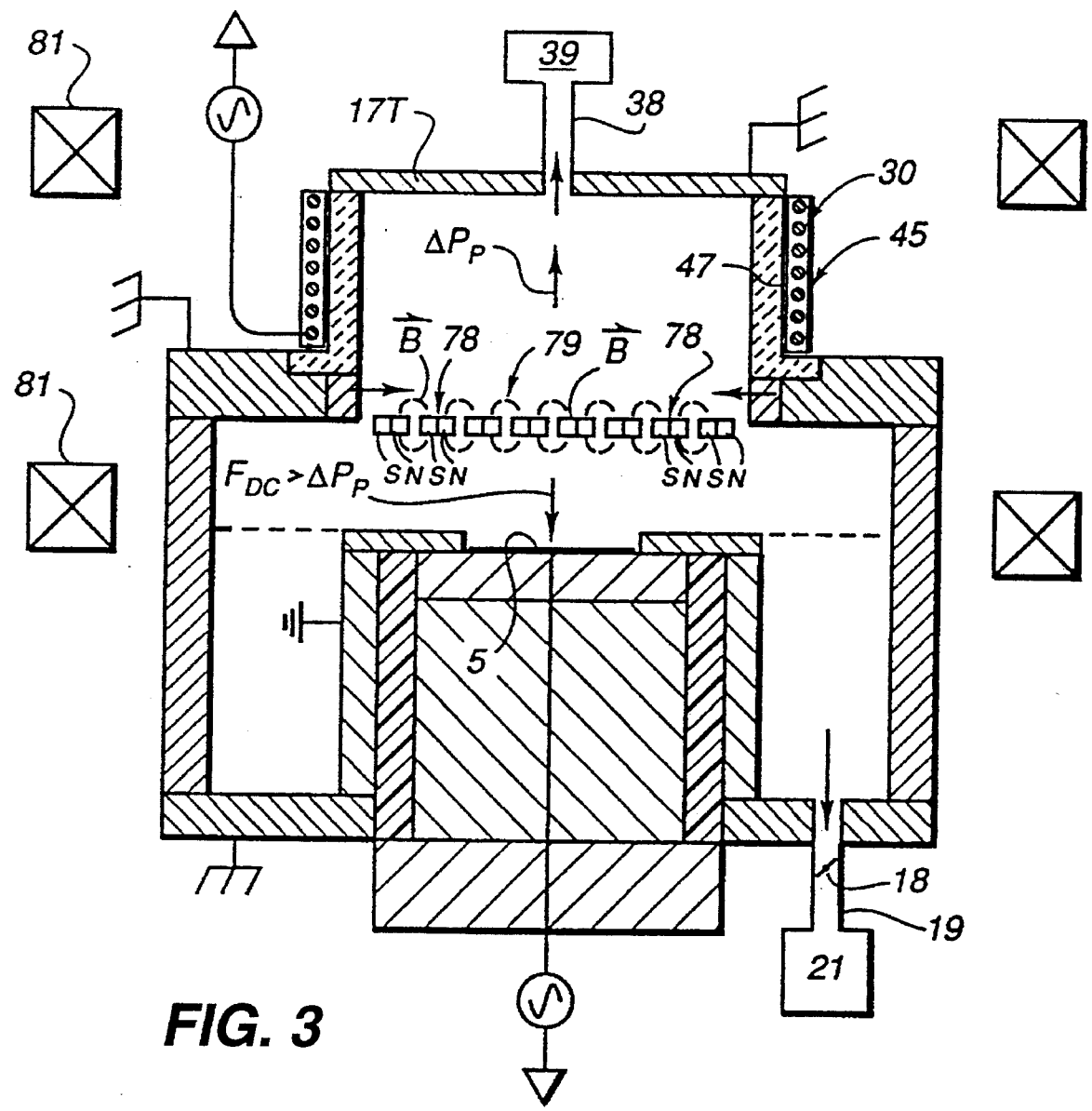

FIGS. 1–3 are schematic sectional views of a plasma reactor chamber system 10 for processing a semiconductor wafer 5 which uses an inductive plasma source arrangement, a magnetically-enhanced plasma source arrangement, a capacitively coupled bias arrangement and other aspects of our present invention. The three figures illustrate preferred and alternative features of our system; three figures are used because of drawing space limitations. The exemplary chamber is a modification of that depicted in our co-pending incorporated continuation-in-part patent applications, which include an integral transmission line structure. The salient features of our invention are applicable generally to plasma reactor chambers. Furthermore, it will be understood by those of skill in the art and from the description below that various features of the invention which cooperatively enhance the performance of the reactor system may be used separately or may be selectively omitted from the system. For example, the process conditions provided by the inductive plasma source arrangement and capacitively coupled bias source arrangement frequently eliminate any need for magnetic enhancement.

The exemplary system 10 includes a vacuum chamber housing 11, formed of anodized aluminum or other suitable material, having sidewalls 12 and top and bottom walls 13 and 14. Anodized aluminum is preferred because it suppresses arcing and sputtering. However, other materials such as bare aluminum with or without a process-compatible liner of polymer or quartz or ceramic can be used. Top wall 13 has a central opening 15 between a lower chamber wafer processing section 16B defined between walls 12—12 and an upper chamber source section 16A defined by a dome 17. The dome may be configured as an inverted single- or double-walled cup which is formed of dielectric material such as, preferably, quartz or several other dielectric materials, including alumina and alpha-alumina (sapphire). In the preferred arrangement shown in FIG. 1, the dome 17 comprises a cylindrical wall 17W of dielectric such as quartz and a cover or top 17T typically of aluminum or anodized aluminum. For processes such as high selectivity oxide etching, a silicon or silicon-containing top wall means, and silicon covered dome sidewalls are preferred.

As shown in FIG. 1, the evacuation of the interior of the chamber housing 11 (chamber 16) is controlled by a throttle valve 18 (which regulates pressure independent of flow rate) in a vacuum line 19 which is connected to the bottom wall 14 and connects to a vacuum pumping system 21 comprising one or more vacuum pumps.

As described in Section 10, the chamber components, including the chamber walls and dome, can be heated and/or cooled for process performance. For example, the dome can be heated or cooled by a liquid or gas heat transfer medium, or heating elements can be used to heat the dome directly.

As described in Section 2 and depicted in FIG. 2, process gases, purge gases, diluents, etc., can be supplied to the chamber by three manifold injection sources, G1, G2, G3, located, respectively, at the base of the source (dome), the top plate 17T of the source, and peripheral to the wafer. The gases are supplied to the chamber 11, for example, typically from one or more sources of pressurized gas via a computer-controlled flow controller (not shown). At the main gas inlet manifold G1, the gases enter the internal vacuum processing chamber 16, as indicated at 22, through a quartz ring gas manifold 51, which is mounted on the inside of or integral with, top wall 13. The manifold 23 preferably supplies etching gas and/or deposition gas at a slight upward angle to the chambers/chamber sections 16B and 16A for developing an etching and/or deposition plasma upon application of RF energy. A top manifold arrangement G2 in the top plate 17T of the dome 17 may be used to inlet reactant and other gases into the chamber 16. Also, a manifold arrangement G3 may be provided which is peripheral to the wafer to supply reactant and other gases.

RF energy is supplied to the dome by a source comprising an antenna 30 of at least one turn or coil which is powered by an RF supply and matching network 31. The antenna 30 preferably has a multiple turn cylindrical configuration. The coil 30 defines a minimum conductor electrical length at a given frequency and a given source (coil) diameter and preferably has an electrical length less than one-quarter wavelength ($<\lambda/4$) at the operating frequency. By itself, the antenna 30 is not a resonator but is tuned to resonance as described below in Section 5 for efficient inductive coupling with the plasma source by Faraday's law of inductive coupling.

Preferably, the gas flow from the chamber source section 16A is downward toward the wafer 5 and is then pumped radially outward from the wafer. To this end, an annular vacuum manifold 33 may be defined about cathode transmission line structure 32, between chamber wall 12 on one side and the outer transmission line conductor 320 on the other, and between the chamber bottom wall 14 on the bottom and a conductive pumping screen 29 on the top. The manifold screen 29 is interposed between the vacuum manifold 33 and the wafer processing chamber 16B and provides a conductive electrical path between chamber walls 12 and the outer conductor 320 of the transmission line structure 32. The manifold 33 defines an annular pumping channel for implementing uniform radial pumping of exhaust gases from the periphery of wafer 5. The exhaust manifold 33 communicates into the exhaust gas system line 19. The gas flow is along paths 22 from manifold G1 into the dome/source and/or along path 24 from manifold G2 into the dome/source and/or along paths 26 from manifold G3 radially inward toward the wafer 5. The overall gas flow is along path 34 from the upper chamber source section 16A toward wafer 5, along path 36 from the wafer and through screen 29 into the gas outlet manifold 33, and along path 37 from the exhaust manifold 33 to the exhaust system 21. It should be noted that the conductive manifold screen 29 and the cathode transmission line structure are optional. Typically, at the low end of the frequencies of interest, the wavelength is very long and, thus, the transmission line structure is unnecessary.

This contrasts with conventional RF system arrangements, in which the RF power is applied between two electrodes, typically the wafer support electrode 32C, the upper surface of which supports wafer 5, and a second electrode which is the sidewalls 12, top wall 13 and/or manifold 23 of the reactor chamber.

Specifically, the antenna 30 is positioned outside and adjacent the dome 17 and the plasma chamber 16A for coupling the RF electromagnetic (em) energy into the source chamber 16A to induce electric fields in the process gas. By Faraday's Law of induction coupling, the changing B (magnetic) component of the em energy energizes the process gas and thus forms a plasma in chamber 16 (numeral 16 collectively designates the chamber 16A and 16B and the plasma) characterized by relatively high density and low energy ions. The plasma is generated in the dome 17 concentrated in the small volume defined within the coil antenna 30. Active species including ions, electrons, free radicals and excited neutrals move downstream toward the wafer by diffusion and by bulk flow due to the prevailing gas flow described herein. Also, as described in Section 7 an appropriate magnetic field can be used to extract ions and electrons toward the wafer as described below. Optionally, but preferably, a bias energy input arrangement 41, FIG. 1, comprising a source 42 and a bias matching network 43 couples RF energy to the wafer support electrode 32C for selectively increasing the plasma sheath voltage at the wafer and thus selectively increasing the ion energy at the wafer.

A reflector 44 which essentially is an open-bottom box encloses the antenna at the top and sides but not at the bottom. The reflector prevents radiation of the RF energy into free space and thereby concentrates the radiation and dissipation of the power in the plasma to enhance efficiency.

As described in detail in Section 7, a Faraday shield 45, FIG. 3, may be positioned just inside, above and below the antenna 30 to permit the magnetic field coupling to the plasma but preclude direct electric field coupling, which could induce gradients or non-uniformities in the plasma, or accelerate charged particles to high energies.

As described in Section 8, optionally, one or more electromagnets 47—47, FIG. 2, or permanent magnets are mounted adjacent the chamber enclosure 11 for providing a magnetic field for enhancing the density of the plasma at the wafer 5, for transporting ions to the wafer, or for enhancing plasma uniformity.

As is described fully in Section 4, our invention uses the magnetic component of inductively coupled electromagnetic energy, typically at frequencies much lower than microwave or microwave-ecr frequencies, to induce circular electric fields inside a vacuum chamber for generating a plasma characterized by high density and relatively low energy, without coupling potentially damaging high power RF energy through the wafer 5. In the preferred, illustrated downstream plasma source arrangement, the RF energy is fully absorbed remote from the wafer, with high plasma density, ensuring that the wave does not propagate to the wafer and thus minimizing the probability of damage. Selectively, and optionally, RF bias energy is applied to the wafer support electrode 32C for increasing the wafer sheath voltage and, thus, the ion energy, as required.

Our chamber 11 is capable of processing semiconductor wafers—deposition and/or etching—using total chamber pressures of about 0.1 mt to about 50 torr, and, for etching, typically 0.1 mt to 200 mt. Our chamber can operate at pressures <5 millitorr and, in fact, has run successfully at 2 millitorr. However, higher pressures are preferred for certain processes because of the increased pumping speed and higher flow rates. For example, for oxide etching a pressure range of about 5 mt (millitorr) to about 50 mt is preferred. Such relatively high pressures require close spacing between the source and the wafer. Our chamber can operate successfully at very suitable, close spacing, d, between the wafer 5 and the bottom turn of the antenna 30 of about 5 centimeters/2 inches without charge-up damage to sensitive devices and, thus, is able to realize the advantages of such very close spacing: enhanced etch rates and selectivity; reduced bias voltage requirement and ion energy requirement for a given etch rate; and enhanced etch uniformity across the wafer. For example, reducing the spacing, d, between the wafer 5 and the source antenna 30 from 10 cm/4 in (which itself is close spacing) to 5 cm/2 in has reduced the voltage requirement by half and has increased the uniformity from about 2.5 percent to about 1 percent.

2. Multiple Gas Injection

As mentioned, our chamber incorporates multiple gas injection sources G1, G2, G3, FIG. 2, for the purpose of injecting reaction, purge, etc., gases at different locations to enhance a particular process according to the requirements of that process (etching, deposition, etc.) and the particular material(s) used in that process. First, the chamber includes a standard radial gas distribution system G1 at the periphery of the base/bottom of the source region 16B. In a presently preferred configuration, the G1 injection system comprises a quartz gas distribution ring 51 at the bottom of the source and a peripheral annular manifold 52 defining a distribution channel which feeds gas to the ring. The ring has inward facing radial holes 53—53 and, preferably, stepped sintered ceramic porous gas diffuser plugs 54—54 inserted in the holes to prevent hollow cathode discharge.

The second gas injection arrangement, G2, comprises a grounded or floating or biased dome top plate 17T of material such as anodized aluminum having a center gas inlet hole 56 filled with a porous ceramic diffuser disk 57.

The third gas injection source, G3, comprises a ring-shaped gas inlet manifold 58 mounted at the periphery of the wafer 5 (or a gas inlet incorporated into the clamp ring (not shown) used to hold the wafer in position against the support pedestal).

Example: Etching Silicon Oxide Over Polysilicon Using Polymer-Enhanced Selectivity As alluded to above, various types of gases selected from etchant and deposition species, passivation species, diluent gases, etc., can be supplied to the chamber via one or more of the sources G1 through G3, to satisfy the requirements of particular etch and deposition processes and materials. For example, the present inductive source antenna 30 provides a very high density plasma and is very effective in dissociating the gases in the dome source region 16A of the chamber. As a consequence, when a polymer-forming species is supplied to the dome via G1, or G2, the highly dissociated species may coat the interior of the dome at the expense of coating the polysilicon and/or may be so fully dissociated that it does not adhere to the polysilicon surface which is to be protectively coated. A solution is to inlet etchant species such as $C_2F_6$ or $CF_4$ into the source region 16A via G1 or G2 or via G1 and G2, and supply a polymer-forming species such as $CH_3F$ or $CHF_3$ via inlet G3, to form a polymer preferentially on the poly without destructive dissociation.

Example: Etching Silicon Oxide Over Polysilicon Using Silicon-Containing Gas Chemistry Because of the high dissociation of the gases in the source region, fluorine-containing gases (even those in which the fluorine is tied up with carbon) typically produce free fluorine which etches silicon and, thus, reduces the etch selectivity for oxide. When high selectivity is required, a silicon-containing additive gas can be injected to tie up the free fluorine and diminish its silicon etching. The etchant gas and the silicon-containing additive gas can be introduced separately via G1 and G2 or can be introduced as a mixture via G1 and/or G2. Suitable fluorine-consuming silicon-containing additive gases include silane ($SiH_4$), TEOS, diethylsilane and silicon tetrafluoride ($SiF_4$).

The fluorine-consuming and polymer-forming additive gases can be used together in the same process to jointly enhance etch selectivity.

Example: Silicon Oxide Deposition

Deposition rate is enhanced by supplying the oxygen-containing species and a diluent such as $O_2$ and $Ar_2$ via G1 and/or G2 and supplying a silicon-containing gas such as $SiH_4$, via G3.

3. Differential Pumping

FIG. 3 depicts an alternative vacuum pumping configuration. In addition to the vacuum pumping system 21 which is connected to or near the bottom of the chamber, a vacuum pump 39 is connected via line 38 to the source region 16A inside the dome 17. The flow rates of the pumping systems 39 and 21 are selected so they generate vertically across the source region 16B a pressure differential, $\Delta P_p$, which (1) opposes the transport of uncharged particles from the source 16A to the wafer 5, yet (2) is of lesser magnitude that the force, $F_b$, exerted by the bias voltage on charged particles such as electrons and ions. As a consequence of $\Delta P_p$, uncharged particles such as radicals do not reach the wafer 5, but rather flow predominantly out the top vacuum connection 38. As a consequence of $F_{DC}$, $>\Delta P_p$, charged electrons and ions flow predominantly to the processing region. This approach is useful, obviously, where it is desired to selectively keep radicals but not ions out of the wafer processing region. That situation occurs, for example, (1) during etching which uses polymer-forming gas chemistry, but polymers are formed in the source region which adhere to the chamber sidewalls and/or do not adhere well to the desired wafer surface and/or (2) when fluorine radicals are formed in the source region.

4. RF Power, Top and Bias Sources

1). Top or Antenna Source

Referring to FIG. 1, preferably, the operating frequency of the RF power supply 31 for the top source 30 is selected to provide a dense plasma, to minimize damage to sensitive devices and to provide efficient inductive coupling of the RF power to the plasma. Specifically, the upper frequency of the operating range is limited to minimize "current-induced" damage. The lower limit of the operating frequency is selected for efficiency of RF power coupling to the plasma. Preferably, LF/VHF (low frequency to very high frequency) AC power within the range about 100 kHz to 100 MHz is used. More preferably, LF/HF (low frequency to high frequency) power within the range 100 kHz to 10 MHz is used. Most preferably, MF (medium frequency) power within the range 300 kHz to 3 MHz is used.

2). Bottom or Bias Source

The AC power supply 42 for the wafer support cathode 32C, capacitively couples RF power to the plasma, thereby effecting control of various factors including cathode sheath voltage and ion energy, which are controlled independent of the plasma density control effected by the high frequency power. The bias frequency is selected to achieve a number of objectives. First, the upper frequency limit is selected to prevent current-induced charge-up damage to sensitive devices. A lower frequency is selected in part to preclude voltage-induced damage. Lower frequency bias also yields higher wafer sheath voltages per unit bias power (less heating) of substrates and contributes less to plasma density and, thus, affords better independent control of ion density and energy. However, a too low bias frequency allows ions to follow the RF component of the wafer sheath electric field, thereby modulating ion energies. The result would be a higher peak-to-average energy ratio and wider (peak-to-peak) ion energy distribution. Very low bias frequency causes insulation charge-up, inhibiting ion-induced processes during part of the bias frequency control.

We have discovered that, conveniently, the above considerations can be satisfied using bias frequency ranges which correspond to the source frequency ranges. That is, preferably the bias power is within the range about 100 kHz to about 100 MHz (LF/VHF frequencies). More preferably, the frequency of the bias power is within the range about 100 kHz to about 10 MHZ (LF/HF frequency). Most preferably, the frequency of the bias power is within the range 300 kHz to 3 MHz (MF frequencies).

3). Combined Operation of Top and Bias Sources

A preferred feature of the invention is to automatically vary the bottom ot bias power supplied by power supply 42 to maintain a constant cathode (wafer) sheath voltage. At low pressures (<500 mt) in a highly asymmetric system, the DC bias measured at the cathode 32C is a close approximation to the cathode sheath voltage. Bottom power can be automatically varied to maintain a constant DC bias. Bottom or bias power has very little effect on plasma density and ion current density. Top or antenna power has a very strong effect on plasma density and on current density, but very small effect on cathode sheath voltage. Therefore, it is desired to use top power to define plasma and ion current densities, and bottom power to define cathode sheath voltage.

Because the radio frequency of the source 31 driving the antenna 30 is nonetheless much lower than the frequencies used in microwave or microwave-ECR applications, the optional smaller magnets operated at lower DC current by less expensive power supplies can be used, with associated smaller heat loads. In addition, as is obvious from the above discussion, co-axial cable such as 31C can be used instead of wave guides. In addition, the plasma non-uniformities caused by the E×B electron drift in other magnetic-enhanced or assisted systems are absent here, because the applied magnetic fields (both the magnetic component of the HF field applied via the antenna 30 and any static magnetic field applied by magnets 81) are substantially parallel to the electric field at the cathode. Thus, there is no E×B drift in the system.

A magnetic shunt path formed with a high permeability material may be used to allow a B field in the source (upper chamber 16A) but not at the wafer.

Optionally, permanent or electromagnets may be placed in a multi-polar arrangement around the lower chamber 16B, typically in an alternating pole north-south-north-south . . . north-south arrangement, to generate a multi-cusp magnetic mirror at the source and/or chamber walls. The magnets may be vertical bar magnets or preferably horizontal ring magnets, for example. Such magnets may be used to reduce electron losses to the walls, thus enhancing plasma density and uniformity, without subjecting the wafer to magnetic fields.

5. Antenna Tuna and Load

1) Tuning

Typically, the antenna 30 is tuned to resonance by (1) varying the frequency of the generator 31 to resonate with the antenna; or (2) a separate resonating element, connected to the antenna for tuning to resonance. For example, this tuning element can be a variable inductance-to-ground or a variable capacitance-to-ground.

Please note, inductive and capacitive tuning decreases the resonant frequency. As a consequence, it is desirable to build the system to the highest desirable resonant frequency to accommodate the decrease in resonant frequency when using capacitance or inductance tuning variables.

Automatic tuning is preferred and may be executed by using an impedance phase/magnitude detector to drive the tune/load variables. See FIG. 16 and Section 9. Alternatively, a reflected power bridge or VSWR bridge may be used to drive both tune and load variables, but iteration is required.

2) Loading

Conductive, capacitive or inductive load means L can be used to match the source antenna 30 to the impedance of the RF generator 31 and the connecting co-axial cable 31C. For example, a tap or wiper may be ohmically contacted to the antenna close to or at the 50 ohm or 300 ohm or other generator output impedance location along the antenna. Alternatively, a variable inductance or a variable capacitance may be connected to the generator output impedance point 50 on the antenna.

3). Tune and Load Circuits

Referring to FIGS. 4 and 9, preferably, tune means T is provided which is integral to the source antenna 30 to tune the source to resonance. Also, integral load means L is provided to match the input impedance of the source antenna 30 to the output impedance of the associated power generator 31 (or transmission line 31C). Referring to FIG. 4, in one aspect, the tune means T is a variable capacitance which is electrically connected between one end of the antenna 30 and RF ground.

As shown in FIG. 5, in another aspect the load means L may be a variable capacitance which is electrically connected between one end of the antenna and RF ground. Also, the load means may be a variable position tap 60 which applies RF input power to the antenna. See FIG. 6.

In a preferred combination shown in FIG. 7, the tune means T is a variable capacitance which is electrically connected between one end of the antenna 30 and RF ground and the load means L is another variable capacitance which is electrically connected between the other end of the antenna and RF ground. In this arrangement, the RF input power can be applied to the antenna via a tap, that is, by a tap 60 applied along the antenna or at either end thereof. See FIG. 8. Alternatively, the RF power input connection 66 can be positioned at substantially the connection between the load variable capacitance L and the end of the antenna 30, as shown in FIG. 9.

6. Source/Bias Process Control

Our invention also incorporates the discovery that the etch rate of materials such as silicon dioxide is increased and the etch selectivity of silicon dioxide relative to materials such as silicon is increased by using a sufficiently high bias voltage to provide a high silicon dioxide etch rate and periodically pulsing the bias voltage to a low value.

1) Pulse/Modulated Bias-Enhanced Etch Rate and Selectivity

Figure 10:
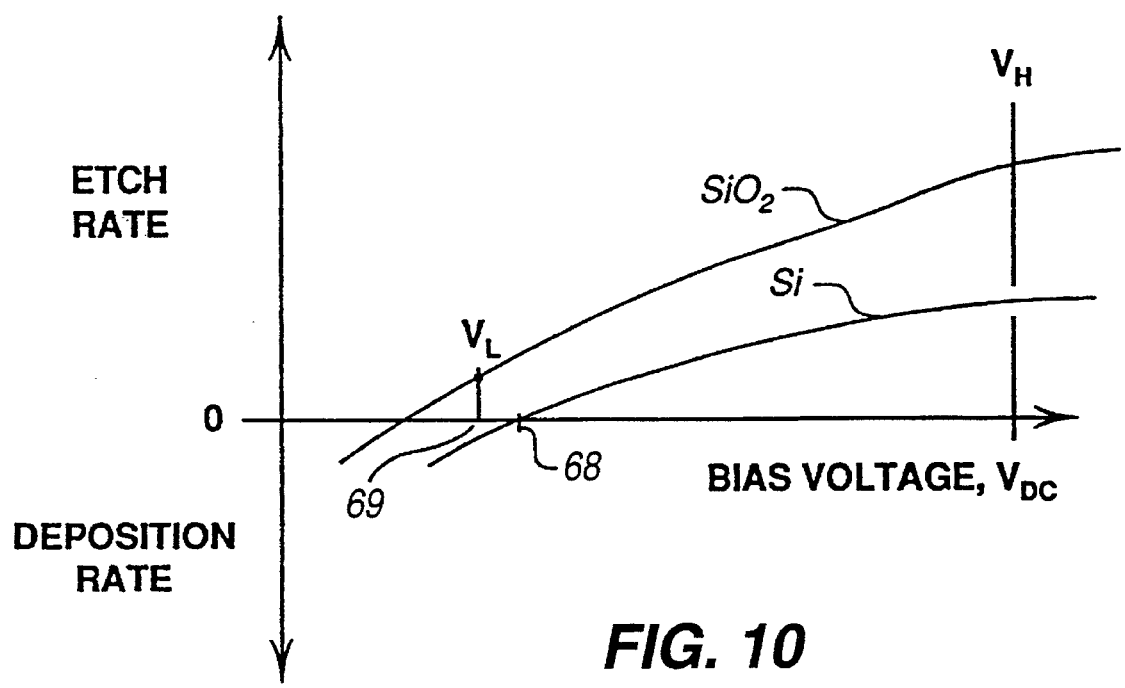
FIG. 10 is a graph of etch/deposition rate versus bias voltage for silicon oxide and silicon.

Referring to FIG. 10, typically the etch rates of materials such as silicon dioxide, $SiO_2$, increase with the bias voltage. Thus, increasing the bias voltage increases the etch rate of the oxide. Unfortunately, however, the etch rates of associated materials in the integrated circuit structure such as silicon/polysilicon also increase with the bias voltage. Thus, the use of a bias voltage of sufficient magnitude to provide a very high silicon dioxide etch rate also effects a silicon etch rate which (although somewhat lower than the oxide etch rate) is undesirably high and reduces selectivity. Quite obviously, when etching silicon dioxide it is highly desirable to have the high oxide etch rate characteristic of high DC bias voltages, $V_h$, combined with the relatively low silicon etch rate characteristic of low DC bias voltages, $V_l$, and, thus, high oxide selectivity.

Figure 11:
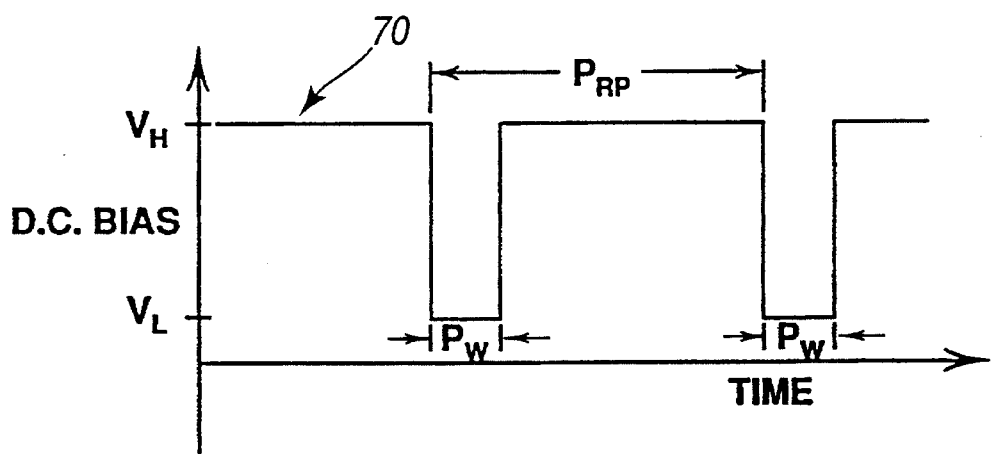
FIG. 11 is a wave form of DC bias voltage applied during etching.

Referring to DC bias voltage wave form 70 in FIG. 11, the seemingly contradictory goals expressed in the previous paragraph of combining the $V_h$ and $V_l$ characteristics are, in fact, achieved in polymer-forming etch processes (those processes which form an etch-suppressant polymer on materials such as silicon) by using a high base line DC bias voltage, $V_h$, and periodically pulsing or modulating the voltage to a low value, $V_l$. $V_l$ is at or below the cross-over point/voltage 68, FIG. 10, between silicon etching and silicon deposition, yet is at or above the oxide cross-over point/voltage 69. As a result, a protective polymer is deposited on the silicon to suppress etching thereof during return to the high rate etch voltage, $V_h$, but no or insufficient deposition occurs on the oxide to significantly suppress the etching of the oxide at $V_h$. Preferably, $V_l$ is characterized by deposition on the poly, but at least slight etching of the oxide. In a presently preferred embodiment, the values of the parameters, $V_h$ (the high DC bias voltage), $V_l$ (the low DC bias voltage), $P_w$ (the pulse width of the low voltage, $V_l$), and $P_{rp}$ (the pulse repetition rate or combined width of the low voltage and the high voltage pulses) are, respectively, –400 V, –225 V, about 0.1 seconds, and about 1 second.

2) Dual Frequency Bias

Figure 12:
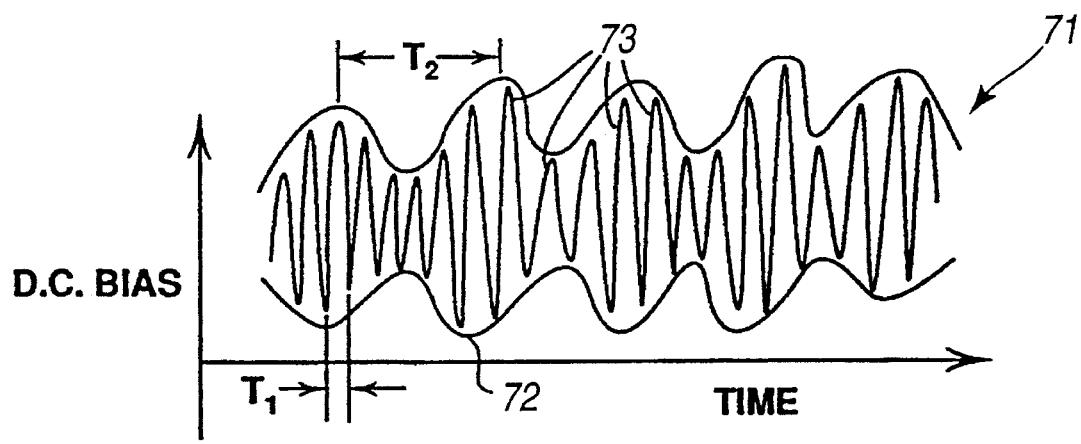
FIG. 12 is an alternate embodiment of a wave form of DC bias voltage applied during etching.

An alternative approach is depicted by DC bias voltage wave form 71 in FIG. 12. A relatively low frequency voltage variation is superimposed on the basic bias voltage frequency. For example, a slow frequency, $T_2$, $\leq 25$ kHz (preferably, 5–10 kHz) may be superimposed or mixed with the base radio frequency, $T_1$, $\leq 2$ MHz. Silicon oxide is an insulator; silicon/polysilicon, typically, has only a very thin native oxide layer. Thus, the low frequency $T_2$ DC bias voltage variations are not seen at the oxide surface because it charges up. However, the essentially uninsulated poly responds to the low frequency $T_2$ in a manner similar to that described previously by forming a protective layer during the low voltage excursion 72 ($V_l$) of the low frequency, $T_2$, cycle. This low frequency-formed layer inhibits etching during the variable high voltage excursions 73 of the high frequency, $T_1$, cycles. As mentioned, the insulating nature of silicon dioxide prevents etch suppressing deposition thereon during the low voltage excursions of $T_2$ and the oxide etch proceeds unabated during the high voltage portions of the $T_1$ cycle.

In short, a protective layer is formed on the silicon during the low voltage excursions 72 of the low frequency cycle, $T_2$, suppressing silicon etching during the high voltage excursions 73 of the high frequency cycle, $T_1$, which etches the oxide rapidly without deposition suppression. The result, similar to that for the pulse/modulated approach described above, is a high silicon oxide etch rate, a relatively low overall silicon etch rate and high etch selectivity for oxide. Please note, the pulsed/modulated approach is presently preferred to the dual frequency bias approach because of the precisely controlled nature of the former approach.

7. Faraday Shield

Consider the typical antenna 30 coil configuration with the load capacitor L at the input end and the tune capacitor T at the far end and with the voltage relatively low at the input end and much higher at the far end. The bottom coil turns, which are closer to ground, are connected to the low voltage RF input. Typically, a plasma is struck by the electrostatic field associated with the relatively high voltage turns near the tune end, which initiates the plasma by electrostatically initiating breakdown of the gas. Following initiation of breakdown, the coupling to the plasma becomes mainly electromagnetic, that is inductive. Such operation is well known. Under steady state conditions, typically both electrostatic coupling and electromagnetic inductive coupling exist. Although the electromagnetic coupling dominates, some processes may be sensitive to the electrostatic field. For example, etching of polysilicon requires low energy particles and low energy bombardment to avoid etching any oxide.

Referring to FIGS. 1 and 15, to decrease the steady state electrostatic field, our chamber optionally incorporates a Faraday shield 45. In one embodiment shown in FIG. 15A, the structure is what we term a "single" Faraday shield 45S comprising a cylindrical array of grounded spaced, axially extending posts or bars, etc., surrounding the dome walls 17W and antenna 30. The single shield may vary from large spacing configurations to those having very small gaps between the shield sections.

FIG. 15B depicts a so-called "full" Faraday shield 45F comprising a pair of concentric shields spaced so that the bars of one overlap the gaps of the other and vice versa. This precludes line of sight paths for the electric field lines through the shield and thereby shunts the electrostatic field.

Although various configurations of the Faraday shields 45S and 45F are possible, the presently preferred configuration is the outwardly flanged, electrically conductive, open-ended cylinder configuration depicted in vertical cross-section in FIG. 1. The single or double wall apertured field surfaces 46, 47, 48 extend around the top, inner (source) and bottom sides, respectively, of the antenna while a ground side 49 (which may be solid) is positioned at the outside of the antenna. This configuration allows the axially-directed, magnetic component of the em wave from the antenna 30 to induce closed loop electric fields in and parallel to the plane of the antenna, which generate the plasma 16. However, the shield 45 capacitively shunts the direct electric field component to ground and prevents the direct electric field component of the high frequency electromagnetic energy from coupling to the plasma. Without the shield 45, the varying voltage along the antenna would couple to the plasma in accordance with Maxwell's equations for capacitive displacement current coupling. This may induce non-uniformities and gradients in the plasma density and in the energy across the wafer 5 and result in process non-uniformity and high energy charged particles. Faraday's Law expressed in integral form requires that a changing magnetic field through a surface results in closed electric fields in that surface. Maxwell's equations that describe the phenomenon in differential form specify that the curl of the induced electric field is proportional to the negative time rate of change of the magnetic field. For sinusoidal excitation, the curl of the induced E is proportional to the radiant frequency of the changing B field as well as its peak amplitude.

In short, a discontinuous or slitted or sectioned Faraday shield minimizes the shorting effect of the shield on the changing em field from the coil, reduces eddy current losses, and allows coupling of the radio frequency, axially directed fringing magnetic field to the plasma for inducing closed loop electric fields which generate the plasma, but precludes direct coupling of the electric field (which varies along the antenna) to the plasma and, thereby, precludes any associated loss of plasma uniformity and process uniformity for high energy charged particles.

8. Magnetic Field Confinement and Enhancement

1) Confinement

Figure 13:
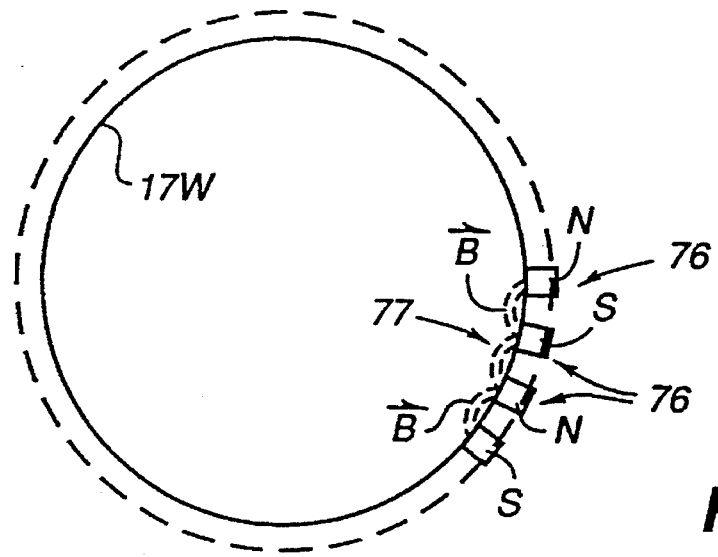
FIG. 13 is a horizontal representation of a magnetic array at the dome of the reaction chamber of the invention.

To reduce losses (decreased plasma density) at the walls 17W of the cylinder/dome source, a magnetic arrangement is provided which generates a peripheral annular (shallow) field. In a preferred arrangement, shown in the FIG. 13 horizontal section representation, this field is provided by a closely-spaced "bucket" or cylindrical multi-polar array of axially-oriented permanent magnets or electro-magnets 76—76, each of which is magnetized across its small dimensions to form a closed, alternating pole, peripheral -N-S-N-S- magnetic field B. The multi-polar array generates a multi-cusp magnetic mirror 77 at the dome wall. Alternatively, the array may be horizontal ring magnets. Such magnets reduce electron losses to the walls 17W, thus enhancing plasma density and uniformity without subjecting the wafer to magnetic fields.

Optionally and similarly, permanent or electromagnets may be positioned in a multi-polar array around the lower chamber 16A, typically in the alternating pole north-south-north-south . . . north-south arrangement, to generate a multi-cusp magnetic mirror at the chamber walls. The magnets may be vertical bar magnets or preferably horizontal ring magnets, for example. Such magnets may be used to reduce electron losses to the walls, thus enhancing plasma density and uniformity, without subjecting the wafer to magnetic fields. In addition, a radial array of magnets can be mounted on the top of the dome or on the top plate 17T of the cylindrical source to reduce losses at the top.

Referring to FIG. 3, in another aspect, the plasma in the substrate processing region 16B can be decoupled from the plasma in the generating or source region 16A by positioning a generally planar grid of magnets at the bottom of the source region/top of the processing region. The magnetic grid comprises closely-spaced generally parallel magnetic bars 78—78 which, like the above-described bucket arrangement, are magnetized NS across their small dimension to provide a planar configuration -NS-NS-NS- magnetic field with the field lines originating at one bar and terminating at the next. The resulting generally planar magnetic filter 79 across the opening 15 of the source confines the magnetic field to the plane/region of the plate and does not penetrate into either the source or wafer region.

Due to the relationship F=qV×B, high energy/high velocity electrons in the source are bent back or repelled by this magnetic field 79 to a greater extent than are ions, and are not able to penetrate to the substrate processing region. This reduces the density of high energy electrons in the processing region 16B and decreases the plasma density in that region. The processing and source regions are decoupled.

This filter magnetic confinement approach is particularly useful for decoupling the plasma region in a compact system. That is, it is useful, for example, for providing a high radical density without high ion density at the substrate, while retaining compactness. In contrast, the conventional approach would require increasing the distance between the substrate and the source to the detriment of compactness. In one preferred arrangement, the filter magnetic confinement is implemented in a machined aluminum plate having hollow bars for air cooling and long thin magnets therein.

The bucket magnet confinement arrangement and the filter magnetic confinement arrangement can be used together.

2) Enhancement

As mentioned above, one or more (preferably, at least two) permanent or electromagnets 81—81, FIG. 3, may be used to define a static, generally axial magnetic field orthogonal to and through both the horizontal plane of the antenna coils and the electric fields induced by the radio frequency RF radiating antenna. Preferably, as described below, one of three field-types is used: uniform, divergent or magnetic mirror.

Figure 14A:
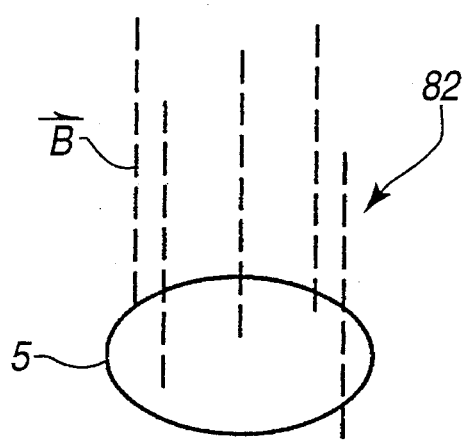
FIGS. 14A–14D are diagrams of various shaped magnetic field lines of systems of the invention.

Referring to FIG. 14A, a homogenous, axial uniform magnetic field 82 applied orthogonally to the wafer 5 by the magnets 81—81 restricts the motion of the electrons to the walls. Because of the inability of ions to follow high frequency field variations, the ions follow the electron deficiency, and are concentrated in the plasma over the wafer. For maximum efficiency, this and other static magnetic fields can be tuned to resonance with the high frequency electromagnetic field: omega=$2\pi F$=Be/m, where B is the magnetic flux density and e and m are the electron charge and mass, respectively.

Figure 14B:
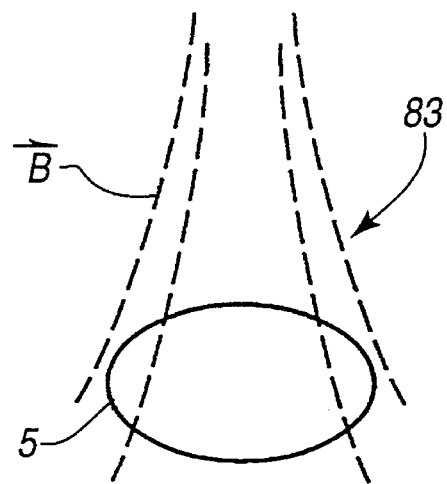

An axially divergent field 83 is depicted schematically in FIG. 14B. By the conservation of magnetic moment, the axial gradient of the magnetic field converts circular translational energy to axial translational energy and tends to drive the electrons and ions from the stronger field regions to the weaker regions thereof. Diverging magnetic fields can be used to push the electrons and ions from the plasma generating regions and to concentrate the plasma at the wafer.

Figure 14C:
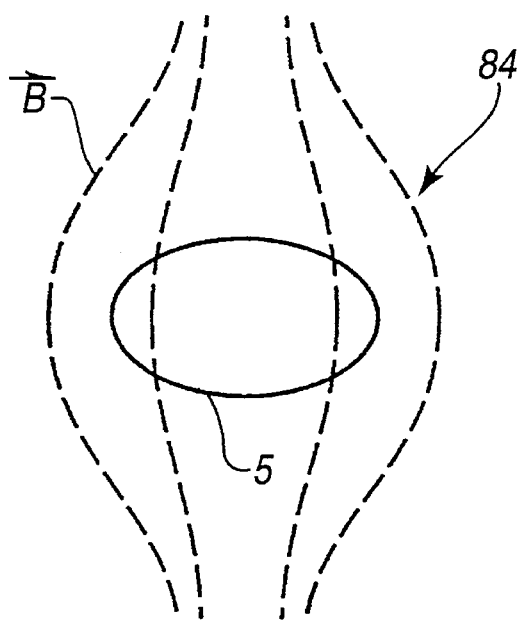
Figure 14D:
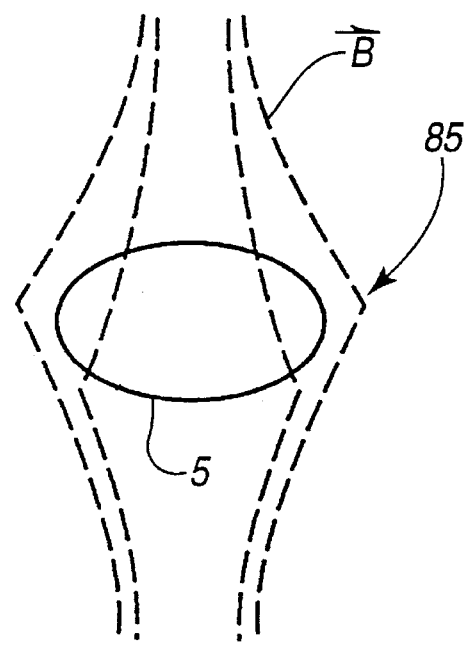

Referring to FIGS. 14C and 14D, there are shown, respectively, a bulging or aiding magnetic field 84 (FIG. 15C) and a cusp-shaped or opposing field 85 (FIG. 15D). The effect of each of these so-called "magnetic mirror" fields is similar to that of the axially divergent field: charged particles are driven from the relatively strong field regions (t the ends here) toward the relatively weak central region.

Selectively positioning the magnet(s) and selecting and varying the strength of the fields provided by the single magnet or cooperating magnets shapes the associated uniform, diverging, or magnetic mirror field in controlled fashion to increase the density of the plasma at the wafer. For magnetic mirror fields, the preferred wafer position for maximum plasma density enhancement is closely adjacent to or at the bulge or cusp, to provide maximum plasma density enhancement.

It may be desired to use an axial magnetic field at the volume of the antenna to enhance plasma generation, but to eliminate the magnetic field at the wafer. An annular disk of high magnetic permeability materials (such as nickel or steel for soft iron) may be interposed below the magnet(s) and the plane of the antenna but above the wafer 5.

3. Extraction

An appropriate magnetic field can be used to extract ions and electrons toward the wafer.

9. Control System

Figure 16:
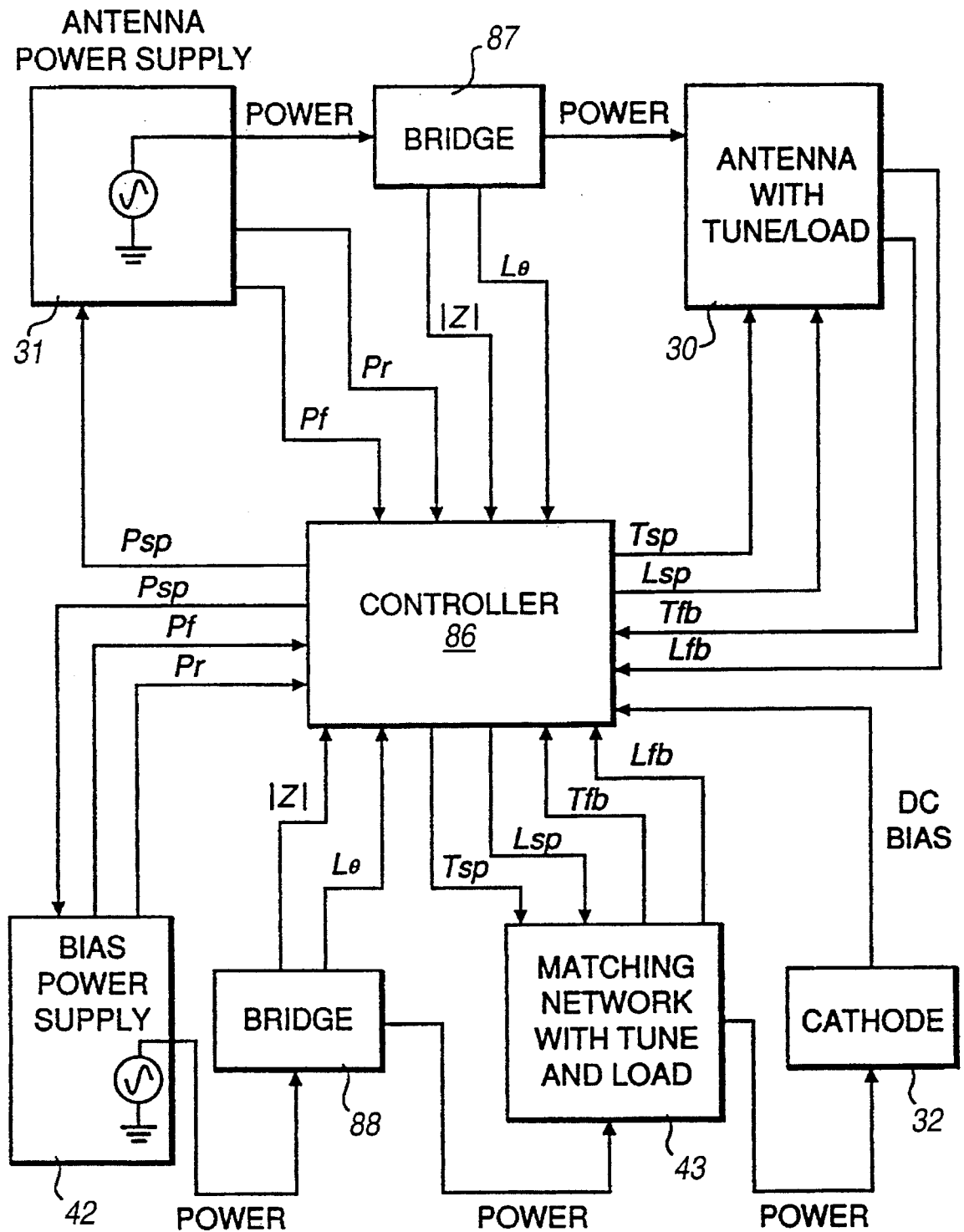
FIG. 16 is a block diagram of a control system, for various components of the system of the invention.

The following descriptions are used here in reference to the control system depicted in FIG. 16:

| Psp: | Power set point | |
|---|---|---|
| $P_f$: | Forward power | Measured by directional coupler located at/inside power supply |
| $P_r$: | Reflected power | Measured by directional coupler located at/inside power supply |
| IZI: | Magnitude of impedance | |
| <phi: | Phase of impedance | |
| Tsp: | Tune set point | |
| Lsp: | Load set point | |
| Tfb: | Tune feedback (measured) | |
| Lfb: | Load feedback (measured) | |

FIG. 16 is a block diagram of an exemplary system for controlling the various components including the power supplies. Here, a system controller 86 is interfaced to antenna power supply 31, impedance bridge 87, antenna 30, bias power supply 42, impedance bridge 88, matching network 43, and cathode 32. The process parameters antenna power and DC bias, selected for ion flux density and ion energy, are supplied as input to the controller 86. Controller 86 may also control other parameters such as gas flow(s), chamber pressure, electrode or wafer temperature, chamber temperature, and others. The controller may preset initial $tune_1$ and $load_1$ conditions by issuing signals on $Tsp_1$ and $Lsp_1$ lines connected to antenna 30. The controller may also preset initial $tune_2$ and $load_2$ conditions by issuing signals on $Tsp_2$ and $Lsp_2$ lines connected to the matching network 43. Typically, these conditions are selected to optimize plasma initiation (gas breakdown). Power may be applied first to either the antenna 30 or to the cathode 32, or applied simultaneously to both. The controller 86 issues power set points on $Psp_1$ line to antenna power supply 31 and on $Psp_2$ line to bias power supply 42 simultaneously or sequentially (in either order).

Avalanche breakdown occurs rapidly in the gas, generating a plasma. Controller 86 monitors forward power ($P_{f1}$) and reflected power ($P_{r1}$) to/from the antenna 30, and monitors forward power ($P_{f2}$) and reflected power ($P_{r2}$) to/from the cathode 32. DC bias (cathode to anode DC voltage) is also monitored as shown by controller 86. The controller adjusts the coil $tune_1$ and $load_1$ parameters by issuing set points on lines $Tsp_1$ and $Lsp_1$, based on either (a) forward power $P_{f1}$ and reflected power $P_1$, or (b) impedance magnitude $|Z_1|$ and impedance phase <$phi_1$. Bridge 87 furnishes impedance magnitude and phase angle information to the controller. The antenna 30 is matched when reflected power $P_{r1}$ is substantially zero and when the impedance (magnitude and phase $|Z_1|$<phi) is the complex conjugate of the coil power supply output impedance. (The zero reflected power condition and the conjugate impedance condition occur simultaneously, so either reflected power may be minimized or impedance may be matched, with the same result. Alternatively, VSWR (voltage standing wave ratio) or reflection coefficient may be minimized). Controller 86 adjusts the cathode 32 and the matching network 43 $tune_2$ and $load_2$ parameters by issuing set points on the $Tsp_2$ and $Lsp_2$ lines, based on either (a) forward power $P_{f2}$ and reflected power $P_{r2}$ or (b) impedance magnitude $|Z_2|$ and impedance phase <$phi_2$. Bridge 88 furnishes impedance magnitude $|Z_2|$ and phase <$phi_2$ information to the controller 86. Matching occurs when, similarly to antenna matching, reflected power $P_{r2}$ is essentially zero, and when impedance (magnitude and phase $|Z_2|$<$phi_2$) is the complex conjugate of the bias power supply 504 output impedance. DC bias is monitored by controller 86, which varies the bias power supply's output power to obtain the desired measured DC bias. Controller 86 subtracts the measured value of DC bias from the desired value of DC bias. If the difference is negative, bias power supply 42 output is increased. If the difference is positive, the bias power supply output is decreased (higher bias power supply output generates a more negative DC bias). Proportional, proportional-integral, or proportional-integral-derivative control or other control may be used in accordance with this method.

Alternatively, instead of the preferred embodiment of adjusting bias power supply 42 output to maintain a constant DC bias, a constant bias power supply output may be used.

In addition to the DC bias servo-matching technique discussed above, automatic tuning can also be accomplished by servoing to the peak-to-peak RF voltage. This latter approach may be advantageous, for example, in certain etch processes which require sufficient conductive surface area in the cathode and anode to provide current to drive the instrumentation. The use of polymer coating techniques may passivate these conductive areas and prevent the current from saturating the instrumentation and obtaining a valid reading. In contrast, the peak-to-peak RF voltage approach is unaffected, especially at the low frequencies associated with the preferred frequency ranges. Measurements can be taken at the matching network 43 close to the chamber rather than at the cathode.

Controller 86 may be a central controller, or a distributed system of controllers.

The turn-on/turn-off sequence may be important for sensitive wafer device structures. Generally, it is preferred to turn the source on first and off last, since sheath voltage change is minimized with such a method. For some applications, it may be preferred to turn bias on first.

10. Transmission Line Structure 32

As described in detail in my referenced U.S. Pat. No. 5,210,466, proper co-axial/transmission line design requires both a feed via a low characteristic impedance, short transmission line from the matching network to the wafer and a return path along the transmission line. This design requirement is satisfied by the integral transmission line structure 32 depicted in FIG. 1 which comprises the cathode 32C, concentric annular conductor 320, and a non-porous low loss insulator 321 which surrounds the cathode 32C and insulates the cathode from the concentric annular conductor 320 and displaces process gases which otherwise might break down. For example, Teflon™ or quartz materials are preferred because they have high dielectric strength, low dielectric constant and low loss. The input side of this structure is connected to the matching network in a manner described below. The insulated cathode 32C and outer conductor 320 provide separate current paths between the matching network 43 and the plasma 16. One reversible current path is from the matching network along the outer periphery of the cathode 32C to the plasma sheath at the chamber (electrode) surface. The second reversible path is from the plasma 16 along the upper inside section of chamber walls 12 then along the conductive exhaust manifold screen 29 and via the inside of the outer conductor 320 to the matching network. Please note, the exhaust manifold screen 29 is part of the uniform radial gas pumping system, and the return path for the RF current.

During application of alternating current energy, the RF current path alternates between the directions shown and the reverse directions. Due to the co-axial cable type of construction of the transmission line structure 32 and, more specifically, due to the higher internal impedance of the cathode 32C (relative to the outside thereof) and the higher impedance toward the outer surface of the conductor 320 (relative to the inner surface thereof), the RF current is forced to the outer surface of the cathode 32C and to the inner surface of the outer conductor 320, in the manner of a co-axial transmission line. Skin effect concentrates the RF current near the surfaces of the transmission line, reducing the effective cross-section of the current path. The use of large wafers, for examples, wafers 4–8 inches in diameter and the commensurately large diameter cathode 32C and large diameter outer conductor 320 provide large effective cross-section, low impedance current paths along the transmission line structure.

Also, if the co-axial-type transmission line structure 32 were terminated in a pure resistance equal to its characteristic impedance $Z_o$, then the matching network would see the constant impedance $Z_o$, independent of the length of the transmission line. However, such is not the case here, because the plasma is operating over a range of pressure and power, and comprises different gases, which collectively vary the load impedance $Z_1$ that the plasma presents to the end of the transmission line 32. Because the load $Z_1$ is mismatched from the non-ideal (i.e., non-lossless) transmission line 32, standing waves present on the transmission line will increase resistive, dielectric, etc., losses between the transmission line and the matching network 43. Although the matching network 43 can be used to eliminate any standing waves and subsequent losses from the input of the matching network back to the amplifier or power supply 42, the matching network, transmission line feed 32 and plasma inside the chamber comprise a resonant system that increase the resistive, dielectric, etc., losses between the transmission line 32 and the matching network 43. In short, the load impedance $Z_1$ will be mismatched with losses, but losses are minimum when $Z_1 \sim Z_o$.

To diminish the losses due to the load mismatch, the co-axial-type transmission line structure 32 is designed to have a characteristic impedance $Z_o$ that is best suited to the range of load impedances associated with the plasma operation. Typically, for the above-described operating parameters (example: bias frequency range approximately 0.3 to 3 MHz) and materials of interest, the series equivalent RC load impedance, $Z_1$, presented by the plasma to the transmission line will comprise a resistance within the approximate range 10 ohm to 100 ohms and a capacitance within the approximate range 50 pico farads to perhaps 400 pico farads. Consequently, as the optimum, a transmission line characteristic impedance $Z_o$ is selected which is centered within the load impedance range, i.e., is approximately 30 to 50 ohms.

It is necessary that the transmission line 32 be very short in order to avoid transformation of the plasma impedance that the matching network sees. Preferably, the transmission line is much less than a quarter wavelength, $\lambda/4$, and, more preferably, is about $(0.05$ to $0.1)$ $\lambda$.

Also, for efficient coupling of power, the inside diameter (cross-section dimension) of the return conductor 320 should not be significantly larger than the outside diameter (cross-section dimension) of the center conductor 32C.

In short, the chamber incorporates a transmission line structure that couples power from the matching network 31 to the plasma 33. That transmission line structure (1) preferably is very short compared to a quarter wavelength at the frequencies of interest or, alternatively, is approximately equal to an integral half wavelength, to prevent undesirable transformation of the plasma impedance; (2) has a characteristic $Z_o$ selected to suppress losses due to the presence of standing waves on the line between the plasma and the matching network; and (3) uses an outside conductor path cross-sectional dimension which is not substantially larger than that of the center conductor.

11. Chamber Temperature Control

Temperature control features which may be incorporated in the reactor chamber system 10 include, but are not limited to, the use of a fluid heat transfer medium to maintain the internal and/or external temperature of the gas inlet manifolds above or below a certain value or within a certain range; resistive heating of the cathode 32C; fluid heat transfer heating or cooling of the cathode 32C; the use of gas heat transfer medium between the wafer 15 and the cathode 32C; the use of a fluid heat transfer medium to heat or cool chamber walls 12–14 and/or dome 17; and mechanical or electrostatic means for clamping the wafer 15 to the cathode 32C. Such features are disclosed in commonly assigned U.S. Pat. No. 4,872,947, issued Oct. 10, 1989, and commonly assigned U.S. Pat. No. 4,842,683, issued Jun. 27, 1989, which are incorporated by reference.

For example, a recirculating closed loop heat exchanger 90 can be used to flow fluid, preferably dielectric fluid, through the block and pedestal of the wafer support/cathode 32C, as indicated schematically by flow path 91, to cool (and/or heat) the wafer support. For silicon oxide etching, dielectric fluid temperatures of, for example, −40° C. are used. As mentioned above, the heat transfer between the wafer 5 and the wafer support 32 is enhanced by an inert gas heat transfer medium such as helium at the wafer-support interface.

The chamber walls and the dome can be heated and/or cooled by air convection (blown air) and/or a dielectric fluid heat exchanger. For example, closed circuit heat exchanger 92 recirculates dielectric fluid at a controlled temperature ranging from heating to cooling, for example, +120° C. to −150° C., along path 93 through the chamber sidewalls. Similarly, the dome sidewalls 17W and top 17T can be heated and/or cooled by heat exchangers 94 and 96 which recirculate fluid along paths 95 and 97, respectively.

In an alternative dielectric heat control system, the antenna coil 30 is positioned between the double walls 17W of the dome, immersed in the recirculating dielectric fluid.

In another alternative approach for dielectric fluid heat control of the dome, the coils of the antenna 30 are encapsulated in high temperature plastic or TEFLON, heat conductive thermal grease is applied between the encapsulated antenna and the dome, and the coil, which is hollow, is heated and/or cooled by flowing the dielectric fluid through the coil. Because RF energy is also applied to the coil and because of the proximity to the source plasma, the dielectric oil must have good dielectric and insulating properties and a high boiling point, in addition to having high specific heat and density for efficient heat transfer at acceptable flow rates. One suitable dielectric fluid is Siltherm available from DuPont.

12. Three Electrode Configuration

Referring to FIG. 1, in a presently preferred embodiment, our chamber incorporates a unique, three-electrode arrangement which affords novel process control and enhancement. The arrangement comprises a cathode (preferably the wafer support electrode 32), an anode (preferably the chamber side and bottom walls) and a top electrode which is (or includes) the dome top plate 17T. As shown in FIG. 1, the top electrode may be floating, grounded or connected to an RF power supply 40. The top electrode advantageously includes various configurations and can be formed of various materials: conductive material, preferably aluminum; dielectric-coated materials such as anodized aluminum; silicon or silicon-containing conductive material such as aluminum-silicon alloy; or may include a sacrificial silicon member 17S such as, but not limited to, a silicon wafer.

1) Grounded Third Electrode

The grounded top plate 17T improves the ground reference surface for the bias voltage (relative to the conventional reference provided by the walls 12) and as a consequence enhances ion extraction from the source 16A to the processing region 16B and so increases process rates (such as etch rates). In addition, the grounded top plate improves the coupling of the plasma (generated in the source) with the wafer.

2) Biased Third Electrode

The use of an RF-biased third electrode in combination with supplying free silicon to the source plasma (using an electrode which includes or is covered with a silicon-containing member), enhances various processing characteristics including etch rate and selectivity. Aided by the strong dissociation characteristics of the source plasma, the silicon enters the gas phase and combines with/scavenges free fluorine. (The dissociation characteristics of the source plasma results in the high concentrations when fluorine-containing gas chemistry is used, for example, to etch oxide. This increases the etch rate of oxide but also increases the etch rate of the associated wafer materials such as polysilicon and, thus, reduces the oxide to poly selectivity). The fluorine scavenging by the free silicon permits the use of a so-called "lighter" polymer chemistry with a lesser tendency to deposit polymer, including on the chamber and on the sidewalls of the oxide. The result is increased oxide etch rate, increased oxide selectivity relative to poly, and enhanced oxide etch anisotropy and vertical profile and decreased microloading. In addition, the free silicon affects the polymerization reaction and results in a more stable passivating polymer deposition on the silicon, preferentially relative to the oxide, with enhanced suppression of the polysilicon etch rate and increased oxide selectivity relative to the silicon.

In addition, the sacrificial silicon-containing third electrode operates synergistically with the use of a carbon- and oxygen-containing gas such as CO and/or $CO_2$ additive, to form polymers on polysilicon surfaces. This increases suppression of silicon etching and enhances selectivity for oxide relative to silicon and increases the polymer sidewall deposition on the oxide, thus enhancing etch anisotropy and vertical sidewall etch profile of the oxide. We use "synergistically" advisedly, because the above process enhancements from combining the carbon- and oxygen-containing gas chemistry with the use of the sacrificial silicon-containing electrode is greater than a mere addition of the individual benefits of these two features. In addition, the use of these features in a gas chemistry containing a $CHF_3$ main etchant also is synergistic in that the oxide etch rate increases, along with a decrease in polysilicon etch rate relative to other fluorine chemistries.

Example: Etching Polysilicon over Silicon Oxide

Polysilicon over silicon oxide on silicon wafers was etched in our three-electrode chamber using pressure within the range about 2 mt to about 20 mt; 50 cc chlorine ($Cl_2$) etchant gas flow rate (manifold G1 only); source power of 1500 watts; bias voltage of −20 volts; and a grounded top electrode (without silicon), providing a polysilicon etch rate of 3500–4000 Angstroms per minute, a vertical etch profile, and a >100:1 selectivity of polysilicon to oxide.

Example: Silicon Oxide Deposition

Two-step bias sputter deposition of silicon dioxide on silicon wafers was done in our three-electrode chamber using a pressure (both steps) of about 2 mt to about 10 mt; gas flow rate of about 200 cc argon/90 cc oxygen/45 cc silane (both steps—manifold G1 only); source power of 2000 watts (both steps); grounded top electrode (both steps); and bias voltage of about −20 volts (first step) and about 100–200 volts (second step), thereby providing a deposition during the first step (no sputtering) of >7500 Angstroms per minute and net oxide deposition during the second step (deposition with profile control sputtering) of approximately 4000 to 5000 Angstroms per minute.

Example: Etching Silicon Oxide Over Polysilicon Using Polymer-Forming Chemistry

Silicon oxide over polysilicon was etched in our three-electrode chamber using pressure 2–30 mt; gas chemistry flow rates $CHF_3$, 30–60 sccm; CO or $CO_2$, 6–18 sccm; and Ar, 100–200 sccm (inlet manifold G1 only); source power of 2000 watts; bias voltage of 200 volts; top electrode 17T with a silicon disk 17S mounted thereto and biased by RF energy of 2 MHz and 1000 watts. The silicon oxide was etched at a rate of 8000 Angstroms per minute with 50:1 selectivity of oxide to poly. Alternatively, the silicon-containing body may be supplemented by a silica coating on the quartz dome walls 17W.

13. Other Features

1) Plasma Control

A preferred feature of the invention is to automatically vary "bottom" power to maintain a constant cathode (wafer) sheath voltage. At low pressures (<500 mt) in a highly asymmetric system, the DC bias measured at the cathode is a close approximation to the cathode sheath voltage. Bottom power can be automatically varied to maintain a constant DC bias. Bottom power has very little effect on plasma density and ion current density. Top or antenna power has a very strong effect on plasma density and on current density, but very small effect on cathode sheath voltage. Therefore, it is desired to use top power to define plasma and ion current densities, and bottom power to define cathode sheath voltage.

2) Differential Bias

As an alternative to biasing the wafer 5 with respect to ground, the bias matching network 43 and the top plate 17T can be "ungrounded" and referenced to one another, as indicated by the dotted connection 50, FIGS. 1 and 2. Referring to FIG. 2, the top plate is driven differentially and balanced so that the voltage $V_{T-SS}$ between the top plate and the wafer is approximately twice the magnitude of the voltage $V_{T-W}$ between the top plate and the wall 12, and approximately twice the magnitude of the voltage $V_{SS-W}$ between the wafer and the wall. This balanced differential drive reduces the interaction of the plasma with the walls and increases the interaction—ion extraction—between the source region 16A and the wafer region 16B.

3) Alternative Configurations

The inventive plasma reactor system is depicted in FIG. 1 in the conventional orientation, that is vertically, with the substrate 5 residing on an electrode 32 (cathode) and the antenna 30 surrounding the dome 17 above the electrode. For convenience, we have referred to the power supplied to the antenna 30 as "antenna" or "source" or "top" power and that supplied to the electrode/cathode 32 as "bias" or "bottom" power. These representations and designations are for convenience only, and it is to be understood that the described system may be inverted, that is, configured with the electrode 32 on top and an antenna located below this electrode, or may be oriented in other ways, such as horizontally, without modification. In short, the reactor system works independently of orientation. In the inverted configuration, plasma may be generated at the antenna 30 and transported upwardly to the substrate 5 located above the antenna in the same manner as described in the specifications. That is, transport of active species occurs by diffusion and bulk flow, or optionally assisted by a magnetic field having an axial gradient. This process does not depend on gravitational forces and thus is relatively unaffected by orientation. The inverted orientation may be useful, for example, to minimize the probability of particles formed in the plasma generation region in the gas phase or on a surface, falling to the substrate. Gravity then reduces the probability of all but the smallest of such particles moving upward against a gravitational potential gradient to the substrate surface.

4) High and Low Pressure Operation and Variable Spacing

Our chamber design is useful for both high and low pressure operation. The spacing, d, between the wafer support cathode 32C and the plane of the bottom coil or turn of the antenna may be tailored for both high and low pressure operation. For example, high pressure operation at 500 millitorr–50 torr preferably uses spacing d≦ about 5 centimeters, while for lower pressure operation over the range <0.1 millitorr–500 millitorr, a spacing d>5 centimeters may be preferable. The chamber may incorporate a fixed spacing d, as shown, or may utilize variable spacing designs such as interchangeable or telescoping upper chamber sections. The reactor system 10 is useful for processes such as high and low pressure deposition of materials such as silicon oxide and silicon nitride; low pressure anisotropic reactive ion etching of materials such as silicon dioxide, silicon nitride, silicon, polysilicon and aluminum; high pressure plasma etching of such materials; and CVD faceting involving simultaneous deposition and etchback of such materials, including planarization of wafer topography. These and other processes for which reactor system 10 may be used are described in commonly assigned U.S. patent application Ser. No. 07/560,530, abandoned (AMAT file no. 151-2), entitled VHF/UHF PLASMA PROCESS FOR USE IN FORMING INTEGRATED CIRCUIT STRUCTURES ON SEMICONDUCTOR WAFERS", filed on Jul. 31, 1990, in the name of Collins et al, which Collins et al patent application is incorporated by reference.

14. Apparatus Examples

A present working embodiment of my system incorporates the source configuration and the antenna configuration depicted in FIG. 1. The 5-inch high quartz source chamber 17 has a diameter of 12 inches. The 2 MHz, 13-inch diameter, 4-inch high, 13 turn coil antenna is terminated at both ends (with variable capacitors L and T which are grounded), spaced about 0.25 inch from (below) the ground plane, and surrounds the source. Reactive load matching is supplied by the variable capacitor L (10–3000 picofarad variable cap, rated 5 kV). Also, capacitive tuning of the antenna to resonance is provided by a tuning capacitor T (5–100 picofarad, 15 kV rating). Operation using source RF energy of 2 kilowatt, 2 MHz provides a plasma which extends to the wafer, which is 2 inches downstream (beneath the source). This provides a plasma density of $1-2\times10^{12}/cm^3$ and ion saturation current density of 10–15 $mA/cm^2$ downstream at the wafer. A bottom or bias of 2 MHz, 600 watts applied to a 5-inch wafer positioned on the support electrode approximately 2 inches below (downstream) of the antenna provides a 200 volt cathode sheath voltage.

15. Processes

As indicated above, the above-described reactor embodying my present invention is uniquely useful for numerous plasma processes such as reactive ion etching (RIE), high pressure plasma etching, low pressure chemical vapor deposition (CVD) including sputter facet deposition and planarization, and high pressure conformal isotropic CVD. Other applications include, but are not limited to, sputter etching, ion beam etching, or as an electron, ion or active neutral plasma source.

(Those of usual skill in the art will appreciate that the present invention is not limited to the use of a dome per se. Rather, it applies to substantially any configuration having a source region and processing region. This includes, for example, the "stepped", domed chamber configuration depicted in the drawings as well as a more conventional, non-stepped configuration in which the source and processing region or chamber sections are substantially the same cross-section.)

Having thus described preferred and alternative embodiments of my system and process, those of usual skill in the art will readily adapt, modify and extend the method and apparatus described here in a manner within the scope of the following claims.

What is claimed is:

1. An RF plasma processing apparatus for processing of workpieces comprising:
   a) a vacuum chamber in which a plasma is generated;
   b) a workpiece support member adapted for supporting workpieces to be processed within the chamber;
   c) a gas inlet mounted in the chamber for supplying a plasma precursor processing gas to the chamber;
   d) RF power source means for supplying first and second RF power signals;
   e) a coil antenna coupling RF energy from the first RF power signal into the chamber so as to form a high density plasma from said processing gas;
   f) a cathode electrode below or part of the workpiece support member electrically coupled to the second RF power signal so as to create an electric field which assists in attracting charged particles from the plasma toward the cathode electrode; and
   g) a second electrode disposed above said cathode electrode and comprising silicon for chemically interacting with components of said processing gas; wherein said second electrode is controllably heated to increase its reactivity.

2. An RF plasma processing apparatus according to claim 1 wherein said second electrode is in contact with the plasma.

3. An RF plasma processing apparatus according to claim 1 wherein said second electrode is coupled through the plasma to the RF power source.

4. An RF plasma processing apparatus according to claim 1 wherein the first RF power signal has a frequency in the range of about 300 kHz to about 3 MHz.

5. An RF plasma processing apparatus according to claim 1 wherein the second RF power signal has a frequency in the range of about 300 kHz to about 3 MHz.

6. The apparatus of claim 1, wherein said RF power source means supplies a third RF signal to said second electrode.

7. The apparatus of claim 1, wherein said second electrode is grounded.

8. An RF plasma processing apparatus according to claim 1, wherein said coil antenna comprises one or more turns in a spiral arrangement.

9. An RF plasma processing apparatus according to claim 8, wherein said solid source of silicon is an electrode.

10. An RF plasma processing apparatus according to claim 9, wherein said RF power source means supplies a third RF signal to said electrode which is a solid source of silicon.

11. An RF plasma processing apparatus for processing of workpieces comprising:
    a) a vacuum chamber in which a plasma is generated;
    b) a workpiece support member adapted for supporting workpieces to be processed within the chamber;
    c) a gas inlet mounted in the chamber for supplying a plasma precursor processing gas to the chamber;
    d) RF power source means for supplying first and second RF power signals;
    e) a coil antenna coupling RF energy from the first RF power signal into the chamber so as to form a high density plasma from said processing gas;
    f) a cathode electrode below or part of the workpiece support member electrically coupled to the second RF power signal so as to create an electric field which assists in attracting charged particles from the plasma toward the cathode electrode; and
    g) a solid source of silicon in the chamber apart from said workpieces being processed and from said workpiece support for chemically interacting with components of said processing gas;
    wherein said vacuum chamber includes a top chamber portion enclosing a space overlying said workpiece support member and having a controllably heated dielectric wall through which said coil antenna couples said RF energy into said chamber.

12. The apparatus of claim 11, further including heating means for controllably heating said dielectric wall.

13. An RF plasma processing apparatus for processing of workpieces comprising:
    a) a vacuum chamber in which a plasma is generated;
    b) a workpiece support member adapted for supporting workpieces to be processed within the chamber;
    c) a gas inlet mounted in the chamber for supplying a plasma precursor processing gas to the chamber;
    d) RF power source means for supplying first and second RF power signals;
    e) a coil antenna coupling RF energy from the first RF power signal into the chamber so as to form a high density plasma from said processing gas;
    f) a cathode electrode below or part of the workpiece support member electrically coupled to the second RF power signal so as to create an electric field which assists in attracting charged particles from the plasma toward the cathode electrode; and
    g) a solid source of silicon in the chamber apart from said workpieces being processed and from said workpiece support for chemically interacting with components of said processing gas;
    wherein said solid source of silicon is disposed in a space overlying said workpiece support member and supported in a controllably heated portion of said vacuum chamber.

14. The apparatus of claim 13, further including heating means for controllably heating said heated portion.

15. An RF plasma processing apparatus according to claim 13, wherein said coil antenna is disposed intermediate between said workpiece support member and said solid source of silicon.

* * * * *